(12) United States Patent
Wi

(10) Patent No.: US 8,018,163 B2
(45) Date of Patent: Sep. 13, 2011

(54) CAPACITIVELY COUPLED PLASMA REACTOR

(75) Inventor: Soon-Im Wi, Suwon-si (KR)

(73) Assignee: New Power Plasma Co., Ltd., Suwon-si (KR)

( * ) Notice: Subject to any disclaimer, the term of this patent is extended or adjusted under 35 U.S.C. 154(b) by 511 days.

(21) Appl. No.: 12/114,879

(22) Filed: May 5, 2008

(65) Prior Publication Data

US 2009/0102385 A1   Apr. 23, 2009

(30) Foreign Application Priority Data

Oct. 22, 2007 (KR) .................. 10-2007-0106348
Oct. 22, 2007 (KR) .................. 10-2007-0106349

(51) Int. Cl.
*H01J 7/24* (2006.01)

(52) U.S. Cl. .......... 315/111.21; 156/345.44; 156/345.47

(58) Field of Classification Search ............. 315/111.01, 315/111.21; 156/345.51, 345.47, 345.44, 156/345.43
See application file for complete search history.

(56) References Cited

U.S. PATENT DOCUMENTS

| | | | | |
|---|---|---|---|---|
| 5,643,364 A * | 7/1997 | Zhao et al. | ................ | 118/723 E |
| 6,495,963 B1 * | 12/2002 | Bennett | .................... | 315/111.51 |
| 6,858,112 B2 * | 2/2005 | Flamm et al. | ........... | 156/345.48 |
| 6,962,664 B2 * | 11/2005 | Mitrovic | ......................... | 216/59 |
| 7,094,313 B2 * | 8/2006 | Juco et al. | ................ | 156/345.44 |
| 7,342,361 B2 * | 3/2008 | Ellingboe | ............... | 315/111.21 |
| 2006/0219363 A1 * | 10/2006 | Matsumoto et al. | ..... | 156/345.47 |
| 2007/0252529 A1 * | 11/2007 | Belinger | .................. | 315/111.21 |

* cited by examiner

*Primary Examiner* — Thuy Vinh Tran
(74) *Attorney, Agent, or Firm* — NSIP Law

(57) ABSTRACT

A capacitively coupled plasma reactor includes a plasma reactor, a capacitive coupling electrode assembly including a plurality of capacitive coupling electrodes to induce plasma discharge inside the plasma reactor, a main power supply source to supply radio-frequency power, and a distribution circuit to receive the radio-frequency power supplied from the main power supply source and to distribute the received radio-frequency power to the plurality of capacitive coupling electrodes.

40 Claims, 29 Drawing Sheets

CAPACITIVELY COUPLED PLASMA REACTOR

CROSS-REFERENCE TO RELATED APPLICATION

This application claims the benefit under 35 U.S.C. §119(a) of a Korean Patent Application No. 10-2007-0106349, filed on Oct. 22, 2007, and a Korean Patent Application No. 10-2007-0106348, filed on Oct. 22, 2007, the disclosure of both of which are hereby incorporated herein by reference in its entirety.

TECHNICAL FIELD

The following description relates to a capacitively coupled plasma reactor, and more particularly, to a capacitively coupled plasma reactor which uniformly generates large-area plasma, thereby increasing the plasma processing efficiency of a large-area object (i.e., substrate/surface) to be processed.

BACKGROUND

Plasma is a highly ionized gas including positive ions and electrons. Plasma discharge is used for gas excitation to generate an active gas including ions, free radicals, atoms and molecules. An active gas is widely used in various fields. An active gas is generally used in semiconductor fabrication processes, for example, such as etching, deposition, cleaning, ashing and the like.

Types of plasma sources for generating plasma are diverse. Typical examples of plasma sources include capacitively coupled plasma using radio frequency and inductively coupled plasma. A capacitively coupled plasma source has an advantage in that processing productivity is high compared with the other plasma sources because the capability of accurately controlling capacitive coupling and ions is excellent. However, when electrodes for capacitive coupling become bigger to process a large substrate to be processed, the electrodes are likely to be fired, to be deformed or damaged. In this case, since the intensity of an electric field becomes disuniform, the density of plasma is disuniform and the inside of a reactor is likely to be contaminated. Similarly, when the area of an inductive coil antenna is big, an inductively coupled plasma source is difficult in generating plasma in uniform density.

In the semiconductor fabrication industry, more improved plasma processing technologies are required as semiconductor devices are super-miniaturized, silicon wafer substrates to fabricate semiconductor circuits become large, glass substrates to manufacture liquid crystal displays become large and new materials to be processed are developed. Specifically, plasma sources and plasma processing technologies are needed to be improved to be capable of excellently processing large-area substrates.

As the substrates to be processed become large, the entire equipment for production also becomes large and thus the entire area for the equipment increases. Consequently, these result in an increase in the cost of production. In this regard, a plasma reactor and a plasma processing system are needed to minimize the area for the equipment if possible. Specifically, in the semiconductor fabrication process, the productivity per unit area is one of the important factors influencing on the price of a final product. To increase the productivity per unit area, there have been proposed the techniques of effectively laying out the constitution of the production equipment. For example, a plasma rector has been provided to process two substrates in parallel. However, since most plasma reactors to process two substrates have two plasma sources, these substantially fail to minimize the processing equipment.

However, if two or more plasma reactors are positioned in parallel vertically or horizontally so as to share the common parts of each constitution and to parallel process two substrates by using a single plasma source, many advantages can be produced by the reduction of the equipment space and the minimize of the equipment constitution.

Many efforts to increase productivity are continuously made in the semiconductor industry, like the other industries. To increase the productivity, the production equipment needs to be basically increased or improved. However, when the production equipment merely increases, the cost of increasing the processing equipment is incurred and the space equipment for a cleaning room needs to be increased, resulting in high cost.

SUMMARY

Accordingly, in one general aspect, there is provided a capacitively coupled plasma reactor which uniformly generates and maintains large-area plasma.

In another aspect, there is provided a capacitively coupled plasma reactor which uniformly generates high-density plasma by uniformly controlling capacitive coupling between capacitive coupling electrodes.

In still another aspect, there is provided a capacitively coupled plasma reactor which uniformly generates high-density plasma by uniformly controlling supply of a current of the capacitive coupling electrodes.

In yet another aspect, there is provided a capacitively coupled plasma reactor which uniformly generates high-density plasma to be easily through a large area.

In still yet another aspect, there is provided a plasma reactor which uniformly generates high-density plasma through a large area and simultaneously processes two or more large-area substrates to have a high processing rate per equipment area.

In still another aspect, there is provided a capacitively coupled plasma reactor comprising a plasma reactor, a capacitive coupling electrode assembly including a plurality of capacitive coupling electrodes to induce plasma discharge inside the plasma reactor, a main power supply source to supply radio-frequency power, and a distribution circuit to receive the radio-frequency power supplied from the main power supply source and to distribute the radio-frequency power to the plurality of capacitive coupling electrodes.

The capacitively coupled plasma reactor may further comprise an impedance matching device to perform impedance matching, the impedance matching device formed between the main power supply source and the distribution circuit.

The distribution circuit may include a current balance circuit to control balance of a current supplied to the plurality of capacitive coupling electrodes.

The current balance circuit may parallel drive the plurality of capacitive coupling electrodes and include a plurality of transformers having the balance of the current.

A first side of each transformer may be connected in series between ground and a power input terminal through which the radio-frequency is input, and a second side of each transformer may be connected so as to correspond to each capacitive coupling electrode.

The second sides of the transformers each may include a grounded center tab and one end of each second side outputs a positive voltage and the other end of each second side outputs a negative voltage, wherein the positive voltage is provided to the positive voltage electrode of the plurality of capacitive coupling electrodes and the negative voltage is provided to the negative voltage electrode of the plurality of capacitive coupling electrodes.

The current balance circuit may include a voltage level control circuit capable of varying a current balance control range.

The current balance circuit may include a compensation circuit to compensate leakage power.

The current balance circuit may include a protection circuit to prevent damage by an excessive voltage.

The plurality of capacitive coupling electrodes may include a conductive region and an insulating region.

The capacitive coupling electrode assembly may include an insulating layer formed between the capacitive coupling electrodes.

The capacitive coupling electrode assembly may include an electrode mounting plate on which the capacitive coupling electrodes are mounted.

The electrode mounting plate may include a plurality of gas injection holes and a gas supply unit to supply a gas into the plasma reactor through the gas injection holes.

The plasma reactor may include a supporting bed on which a substrate to be processed is placed, and the supporting bed may be biased or not biased.

The supporting bed may be biased by a single frequency power source or two or more different frequency power sources.

The supporting bed may include an electrostatic chuck.

The supporting bed may include a heater.

The plurality of capacitive coupling electrodes may include a plurality of positive voltage electrodes and a plurality of negative voltage electrodes, and the positive voltage electrodes and the negative voltage electrodes may have one or more array structures selected from a linear array structure in which each positive voltage electrode and each negative voltage electrode alternate with each other, a matrix-type array structure, a spiral array structure in which these electrodes alternate with each other, and a concentric circle array structure in which the these electrodes alternate with each other.

The positive voltage electrodes and the negative voltage electrodes may have one or more structures selected from a barrier-type structure, a flat plate-type structure, a protrusion-type structure, a cylindrical post-type structure, a ring-shaped structure, a spiral structure, and a linear structure.

In still another aspect, there is provided a capacitively coupled plasma reactor comprising a first plasma reactor, a second plasma reactor, a first capacitive coupling electrode assembly including a plurality of capacitive coupling electrodes to induce plasma discharge inside the first plasma reactor, a second capacitive coupling electrode assembly including a plurality of capacitive coupling electrodes to induce plasma discharge inside the second plasma reactor, a main power supply source to supply radio-frequency power, and a distributor circuit to receive the radio-frequency power supplied from the main power supply source and to distribute the radio-frequency power to the plurality of capacitive coupling electrodes of the first and second capacitive coupling electrode assemblies.

The capacitively coupled plasma reactor may further comprise an impedance matching device to perform impedance matching, the impedance matching device formed between the main power supply source and the distributor circuit.

The distributor circuit may include a current balance circuit to control balance of a current supplied to the plurality of capacitive coupling electrodes of the first and second capacitive coupling electrode assemblies.

The current balance circuit may parallel drive the plurality of capacitive coupling electrodes of the first and second capacitive coupling electrode assemblies and include a plurality of transformers having the balance of the current.

A first side of each transformer may be connected in series between ground and a power input terminal through which the radio-frequency is input, and a second side of each transformer may be connected so as to correspond to each capacitive coupling electrode of the first and second capacitive coupling electrode assemblies.

The second sides of the transformers each may include a grounded center tab and one end of each second side outputs a positive voltage and the other end of each second side outputs a negative voltage, wherein the positive voltage is provided to the positive voltage electrode of the plurality of capacitive coupling electrodes and the negative voltage is provided to the negative voltage electrode of the plurality of capacitive coupling electrodes.

The current balance circuit may include a voltage level control circuit capable of varying a current balance control range.

The current balance circuit may include a compensation circuit to compensate leakage power The current balance circuit may include a protection circuit to prevent damage by an excessive voltage.

The plurality of capacitive coupling electrodes may include a conductive region and an insulating region.

The first and second capacitive coupling electrode assemblies may each include an insulating layer formed between the capacitive coupling electrodes.

The first and second capacitive coupling electrode assemblies may each include an electrode mounting plate on which the capacitive coupling electrodes are mounted.

The electrode mounting plate of each of the first and second capacitive coupling electrode assemblies may include a plurality of gas injection holes and a gas supply unit to supply a gas into the first and second plasma reactors through the gas injection holes.

The gas supply unit may include a plurality of gas supply conduits.

The gas supply conduits may each include a control valve to independently control gas supply flux.

The first and second plasma reactors may include a supporting bed on which a substrate to be processed is placed, and the supporting bed may be biased or not biased.

The supporting bed may be biased by a single frequency power source or two or more different frequency power sources.

The supporting bed may include an electrostatic chuck.

The supporting bed may include a heater.

The plurality of capacitive coupling electrodes may include a plurality of positive voltage electrodes and a plurality of negative voltage electrodes, and the positive voltage electrodes and the negative voltage electrodes may have one or more array structures selected from a linear array structure in which each positive voltage electrode and each negative voltage electrode alternate with each other, a matrix-type array structure, a spiral array structure in which these electrodes alternate with each other, and a concentric circle array structure in which the these electrodes alternate with each other.

The positive voltage electrodes and the negative voltage electrodes may have one or more structures selected from a barrier-type structure, a flat plate-type structure, a protrusion-type structure, a cylindrical post-type structure, a ring-shaped structure, a spiral structure, and a linear structure.

Other features will become apparent to those skilled in the art from the following detailed description, which, taken in conjunction with the attached drawings, discloses exemplary embodiments of the invention.

BRIEF DESCRIPTION OF THE DRAWINGS

Throughout the drawings and the detailed description, the same drawing reference numerals will be understood to refer to the same elements, features, and structures.

DETAILED DESCRIPTION

Figure 1:
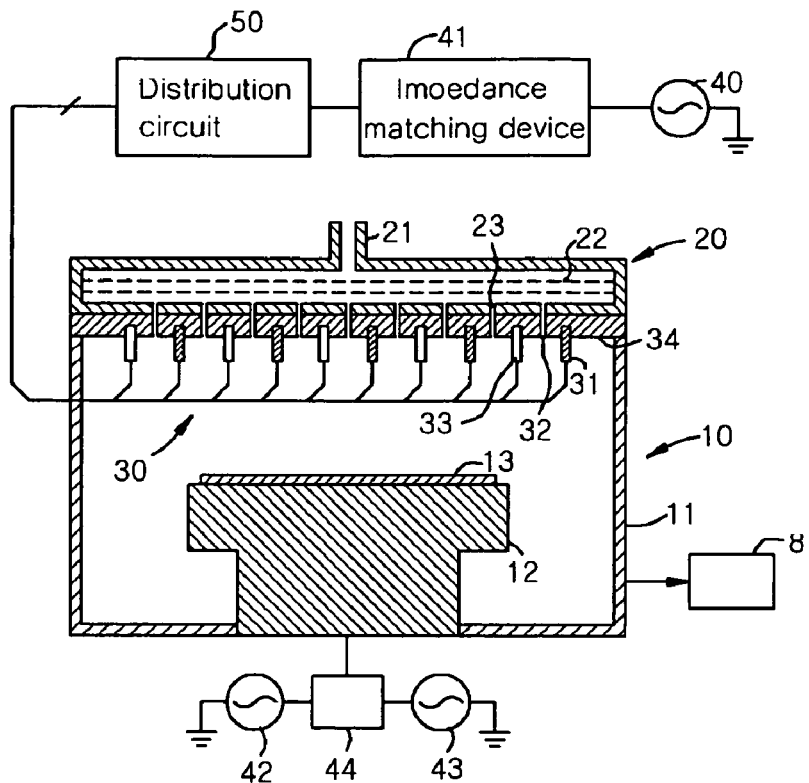
FIG. 1 is a sectional view illustrating a plasma reactor according to an exemplary embodiment.

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. Also, descriptions of well-known functions and constructions are omitted to increase clarity and conciseness. In the drawings, the shapes of elements may be exaggerated for clarity.

FIG. 1 is a sectional view illustrating a plasma reactor according to an exemplary embodiment.

With reference to FIG. 1, a capacitively coupled plasma reactor according to an embodiment comprises a plasma reactor 10, a gas supply unit 20 and a capacitive coupling electrode assembly 30. Inside the plasma reactor 10, there is included a supporting bed 12 on which a substrate 13 to be processed is placed. The capacitive coupling electrode assembly 30 is formed on the plasma reactor 10. The gas supply unit 20 is formed on the capacitive coupling electrode assembly 30 and supplies a gas provided from a gas supply source (not shown) to the inside of the plasma reactor 10 through gas holes 32 formed in the capacitive coupling electrode assembly 30. Radio-frequency power generated from a main power supply source 40 is supplied to a plurality of capacitive coupling electrodes 31 and 33 included in the capacitive coupling electrode assembly 30, through an impedance matching device 41 and a distribution circuit 50, thereby inducing capacitively coupled plasma inside the plasma reactor 10. Plasma processing is performed on a substrate 13 to be processed, using the plasma generated inside the plasma reactor 10.

The plasma reactor 10 comprises a reactor body 11 and the supporting bed 12 on which the substrate 13 to be processed is placed. The reactor body 11 may be made of a metal material, such as aluminum, stainless steel, or copper. The reactor body 11 may be made of a coated metal, for example, anodically processed aluminum or nickel-plated aluminum. The reactor body 11 may be made of a refractory metal. Alternatively, the reactor body 11 may be entirely or partially made of an electrically insulating material, such as quartz or ceramic. As described above, the reactor body 11 can be manufactured by using any materials suitable to perform an intended plasma process. The reactor body 11 may have a structure suitable for uniform generation of plasma, for example, a round structure, a square structure or any other shape structure, depending on the substrate 13 to be processed.

Examples of the substrate 13 to be processed may include a wafer substrate, a glass substrate, a plastic substrate and the like to manufacture various devices, for example, a semiconductor device, a display device, a solar battery and the like. The plasma reactor 10 is connected to a vacuum pump 8. In the exemplary embodiment, the plasma reactor 10 performs the plasma processing on the substrate to be processed at low pressure below atmospheric pressure. However, the capacitively coupled plasma reactor may be used as an atmospheric pressure plasma processing system of performing the plasma processing on the substrate to be processed at the atmospheric pressure.

Figure 2:
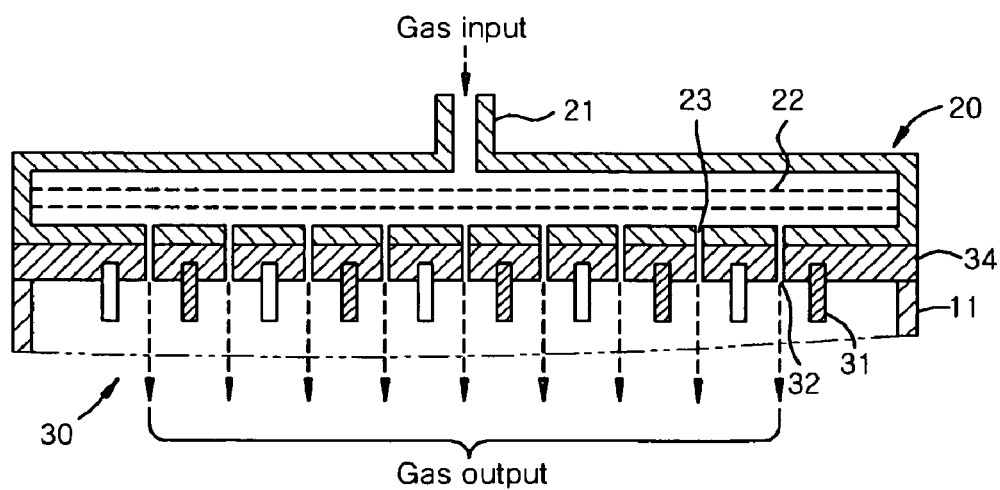
FIG. 2 is a partial sectional view of an upper part of the reactor, illustrating a gas supply unit positioned on a capacitive coupling electrode mounting plate.

FIG. 2 is a partial sectional view of an upper part of the reactor 10, illustrating the gas supply unit 20 positioned on a capacitive coupling electrode mounting plate 34.

With reference to FIG. 2, the gas supply unit 20 is positioned on the capacitive coupling electrode assembly 30. The gas supply unit 20 comprises a gas inlet 21 connected to the gas supply source (not shown), one or more gas distribution plates 22, and a plurality of gas injection ports 23. The plurality of gas injection ports 23 are each connected to correspond to the plurality of gas injection holes 32 of the electrode mounting plate 34. The gas being put through the gas inlet 21 is evenly distributed by the one or more gas distribution plate 22 and is evenly injected to the inside of the plasma reactor 10 through the plurality of gas injection ports 23 and the plurality of gas injection holes 32 each corresponding to the plurality of gas injection ports 23. The gas supply unit 20 may comprise two or more separate gas supply channels (not shown) to separately supply different gases to the inside of the plasma reactor 10, thereby increasing the uniformity of the plasma processing.

Figure 3:
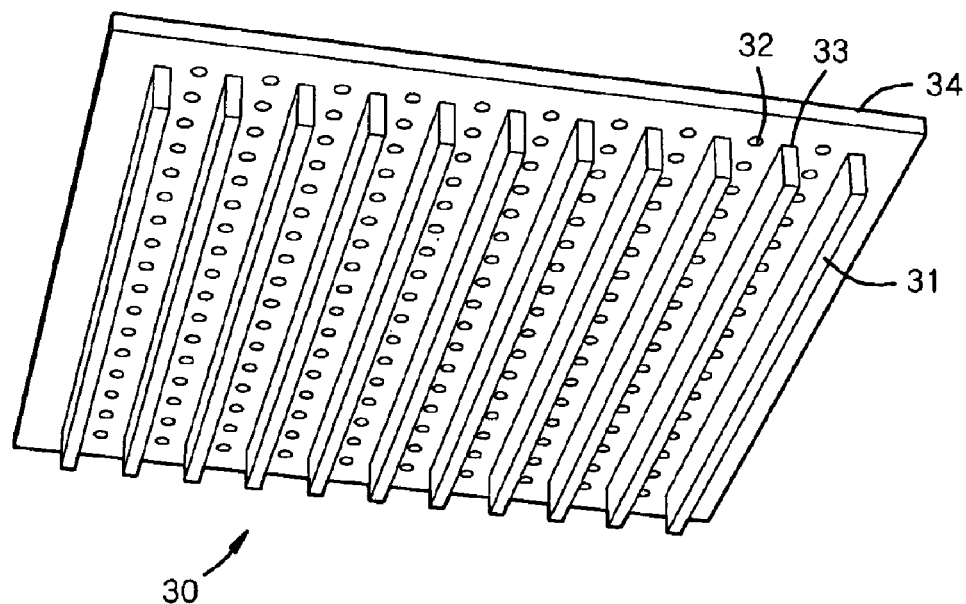
FIG. 3 is a perspective view illustrating a capacitive coupling electrode assembly.
Figure 4:
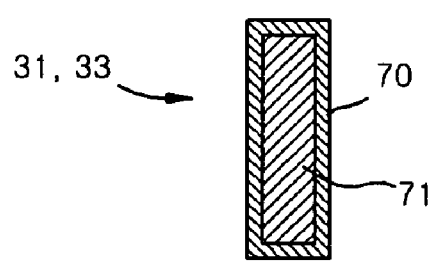
FIG. 4 is a sectional view illustrating a capacitive coupling electrode.

FIG. 3 is a perspective view illustrating the capacitive coupling electrode assembly 30 and FIG. 4 is a sectional view illustrating capacitive coupling electrodes 31 and 33.

With reference to FIG. 3, the capacitive coupling electrode assembly 30 comprises a plurality of the capacitive coupling electrodes 31 and 33 to induce discharge of the capacitively coupled plasma inside the plasma reactor 10. The capacitive coupling electrodes 31 and 33 are mounted onto the electrode mounting plate 34. The electrode mounting plate 34 may be installed so as to cover the ceiling of the reactor body 11. The capacitive coupling electrodes 31 and 33 have a structure in that each positive voltage electrode 33 and each negative voltage electrode 31 which are linearly positioned on the top of the reactor body 11 are alternately arrayed in parallel. A plurality of the capacitive coupling electrodes 31 and 33 has a linear barrier-type structure in which the capacitive coupling electrodes 31 and 33 protrude downwardly from the electrode mounting plate 34. A plurality of the capacitive coupling electrodes 31 and 33 may comprise a conductive region 71 and an insulating region 70 covering the outer surface of the conductive region 71, as illustrated in FIG. 4. A plurality of the capacitive coupling electrodes 31 and 33 may comprise a conductive region 71 only. The shape and array structure of each of the capacitive coupling electrodes 31 and 33 may be variously modified, as described later.

The electrode mounting plate 34 comprises a plurality of the gas injection holes 32. The gas injection holes 32 are formed to be spaced apart by a predetermined distance between the capacitive coupling electrodes 31 and 33. The electrode mounting plate 34 may be composed of a metal material, a non-metal material, or a mixture thereof. When the electrode mounting plate 34 is composed of the metal material, it has an electrically insulating structure between the capacitive coupling electrodes 31 and 33. The electrode mounting plate 34 is installed to form the ceiling of the reactor body 11 but may be installed, along the sidewall of the reactor body 11 to improve the plasma processing efficiency. Otherwise, the electrode mounting plate 34 may be installed at both ceiling and sidewall. The electrode mounting plate 34 may comprise a cooling channel (not shown) or a heating channel (not shown) to suitably control a temperature.

FIGS. 5 through 11 are sectional views of capacitive coupling electrode assemblies, illustrating various modifications of capacitive coupling electrodes.

Figure 5:
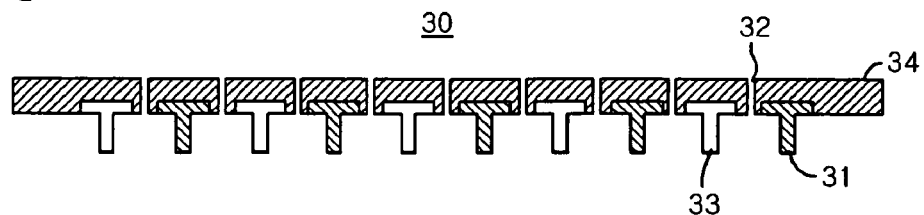
FIGS. 5 through 11 are sectional views of capacitive coupling electrode assemblies, illustrating various modifications of capacitive coupling electrodes.
Figure 6:
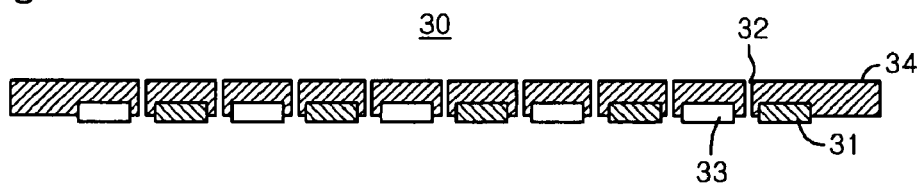
Figure 7:
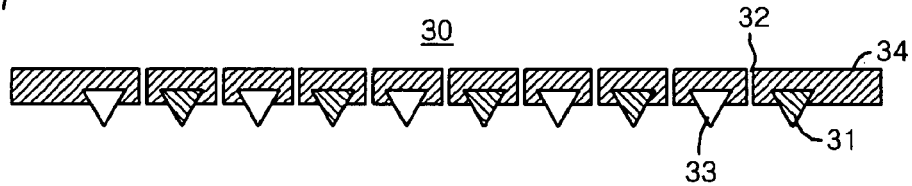
Figure 8:
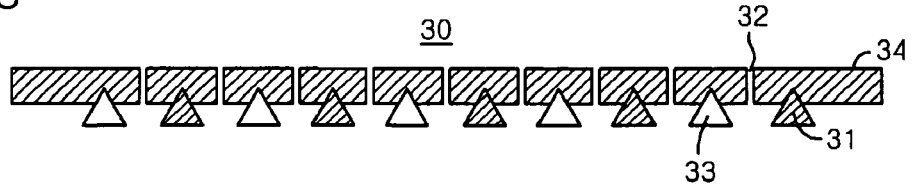
Figure 9:
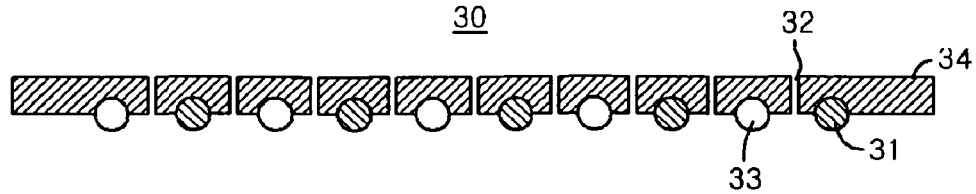
Figure 10:
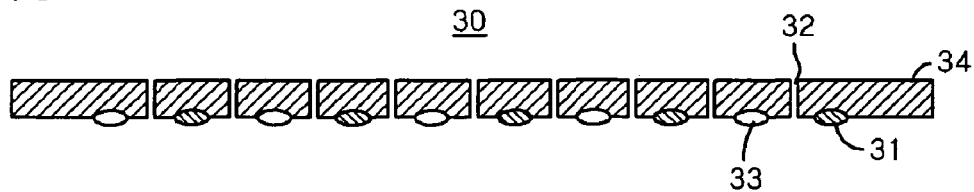
Figure 11:
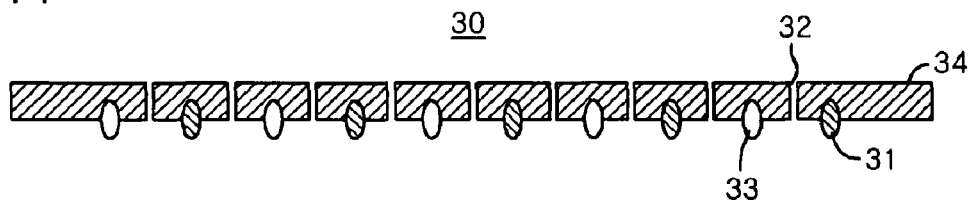

As illustrated in FIG. 5, the capacitive coupling electrodes 31 and 33 may be in the barrier-type structure in which a section of each capacitive coupling electrode is in a 'T' shape structure. In this structure, each capacitive coupling electrode may be installed in the manner that its head part is fixed onto the electrode mounting plate 34 or upside down. As illustrated in FIG. 6, the sections of the capacitive coupling electrodes 31 and 33 may be in a flat plate-type structure having a narrow width. As illustrated in FIG. 7 or 8, the sections of the capacitive coupling electrodes 31 and 33 may be in a triangle structure or an inverted triangle structure. Otherwise, as illustrated in FIGS. 9 through 11, the sections of the capacitive coupling electrodes 31 and 33 may be in a cylindrical rod shape structure, an oval structure being wider in a horizontal direction or an oval structure being wider in a vertical direction. As described above, the capacitive coupling electrodes 31 and 33 may have various structures in which their sectional structure is round, oval or polygonal.

FIGS. 12 through 22 are bottom plan views of the capacitive coupling electrode assemblies, illustrating various modifications of a plan structure and a plan array structure of capacitive coupling electrodes.

Figure 12:
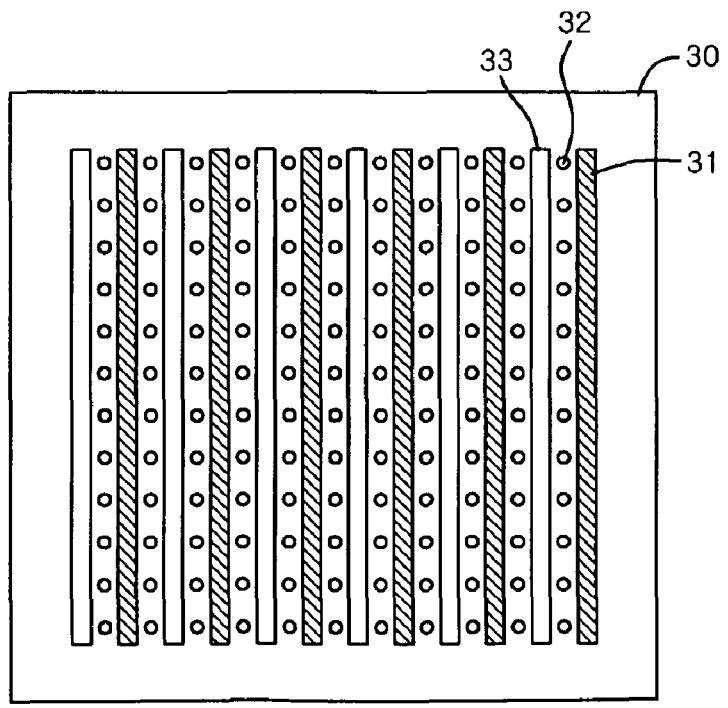
FIGS. 12 through 22 are bottom plan views of the capacitive coupling electrode assemblies, illustrating various modifications of a plan structure and a plan array structure of capacitive coupling electrodes.
Figure 13:
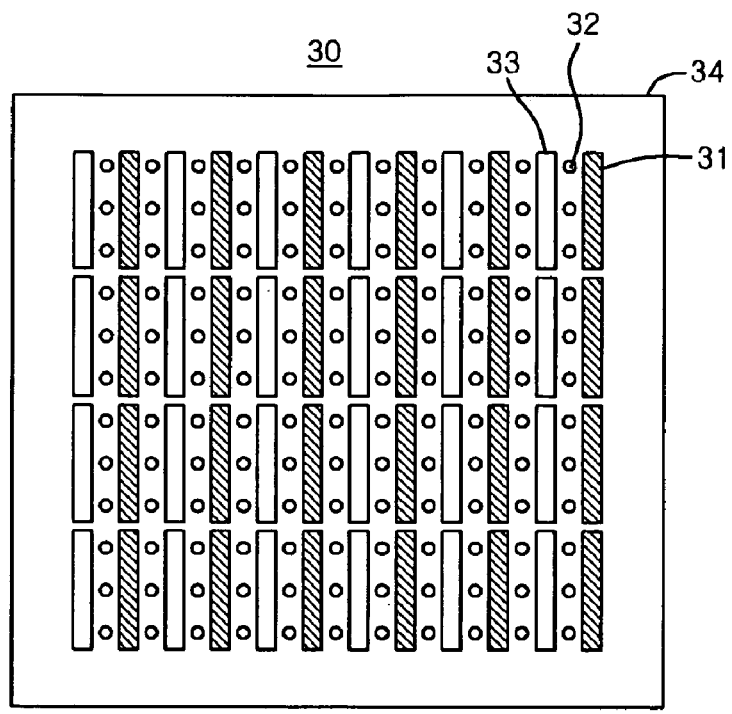
Figure 14:
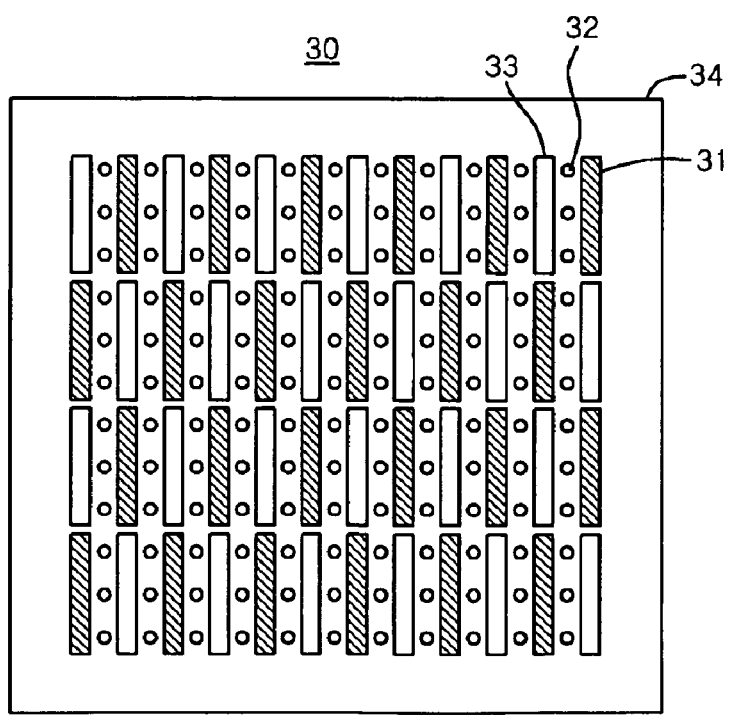
Figure 15:
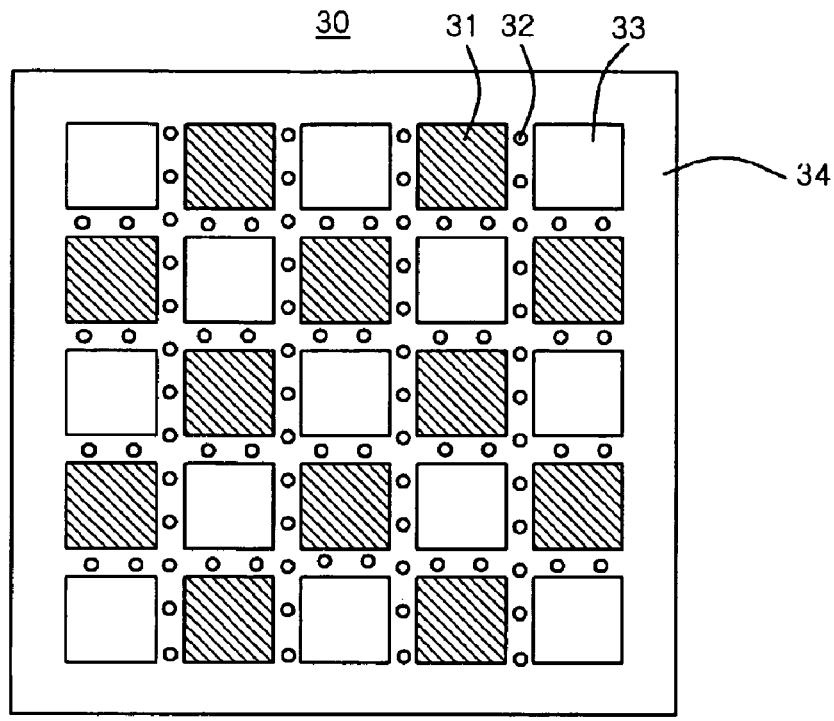
Figure 16:
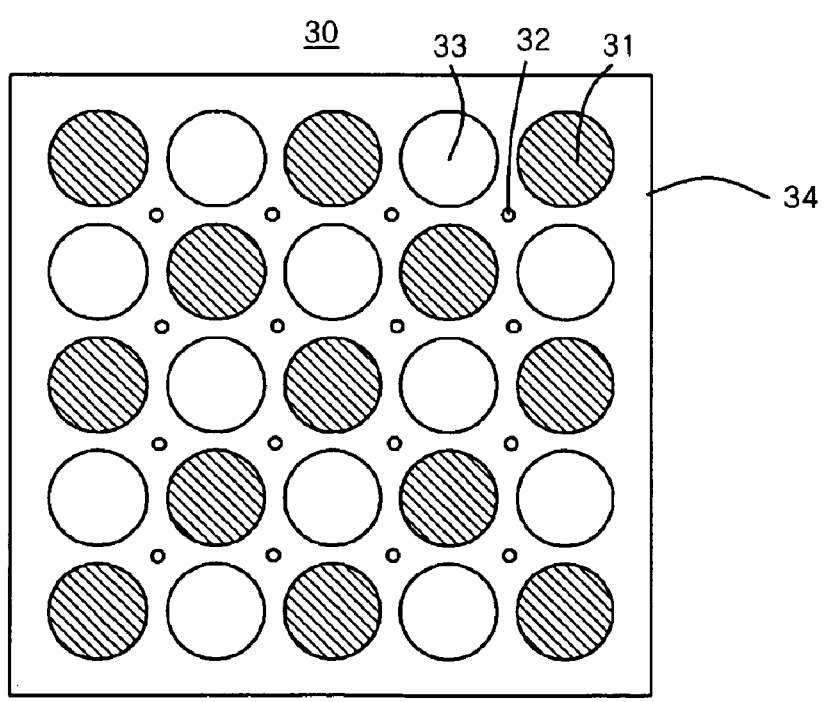
Figure 17:
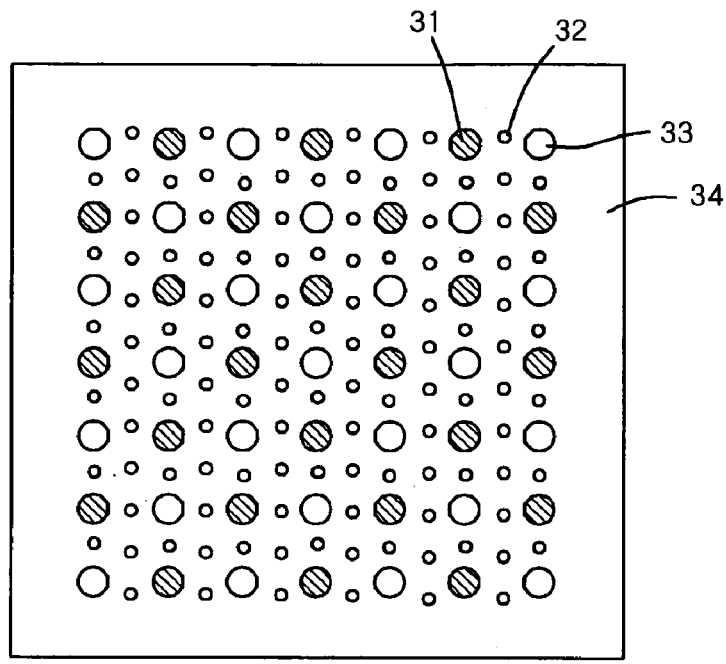
Figure 18:
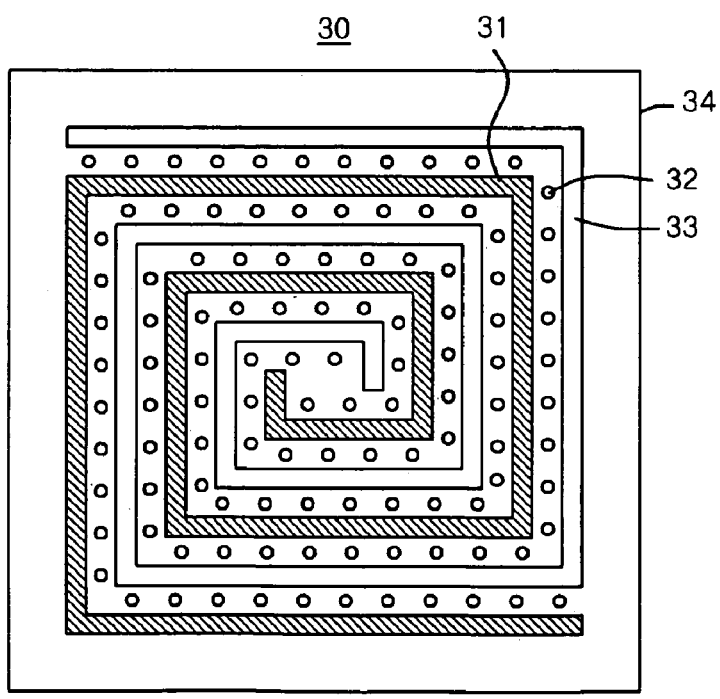
Figure 19:
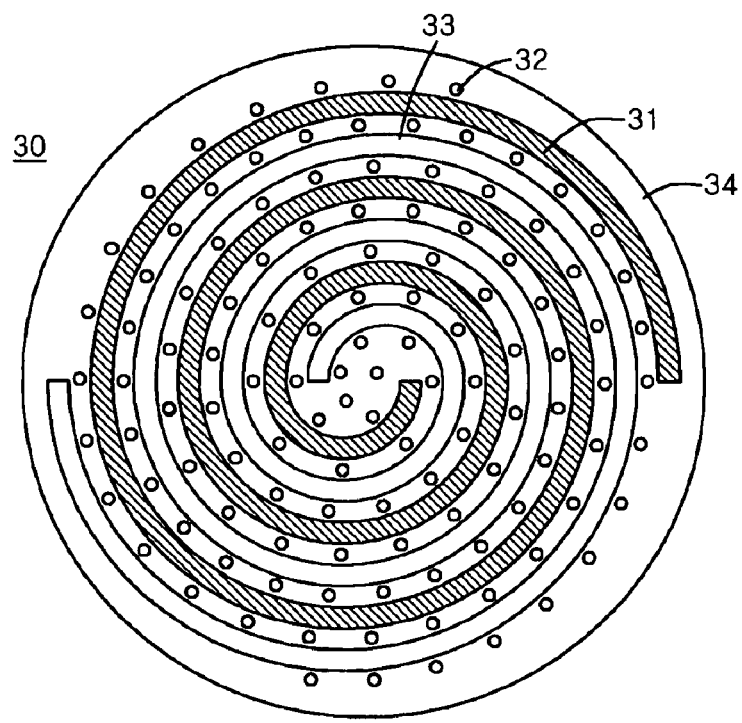
Figure 20:
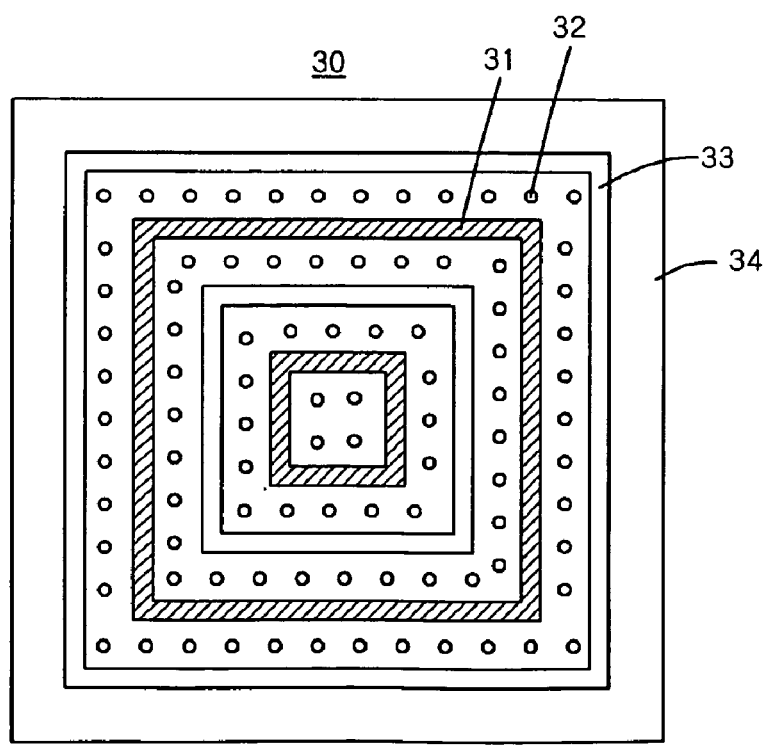
Figure 21:
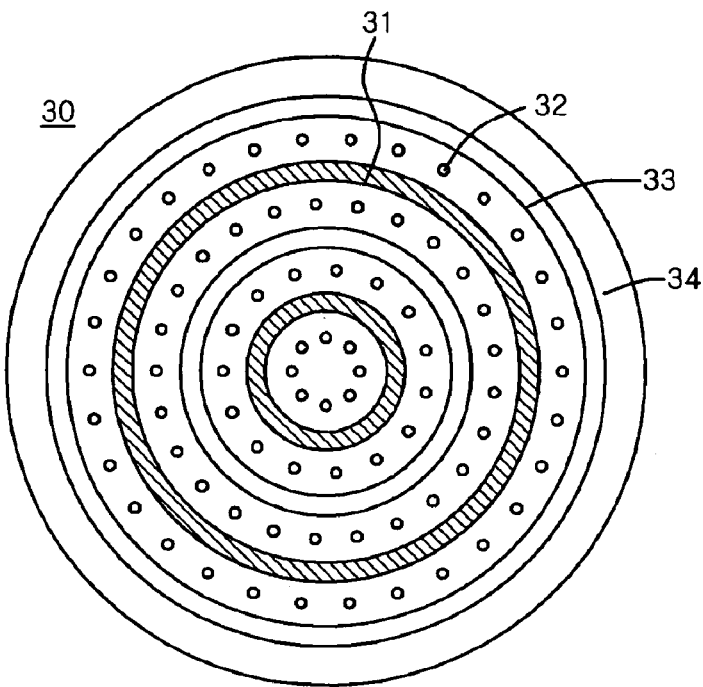
Figure 22:
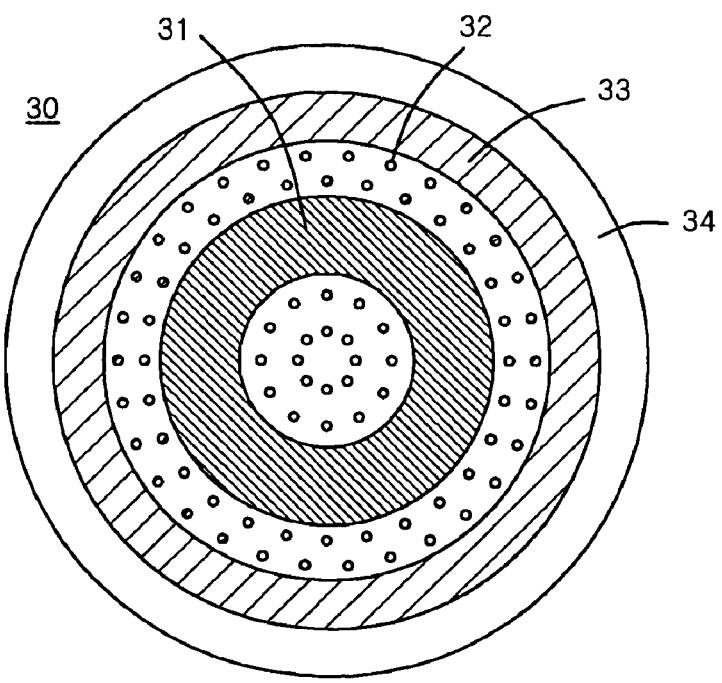

As illustrated in FIG. 12, the positive voltage electrodes 33 and the negative voltage electrodes 31 forming a plurality of the capacitive coupling electrodes 31 and 33 are arrayed to alternate with each other. A plurality of the gas injection holes 32 may be positioned between each positive voltage electrode 33 and each negative voltage electrode 31. As illustrated in FIG. 13 or 14, each positive voltage electrode 33 is divided into parts by a predetermined length and each negative voltage electrode 31 is divided into parts by a predetermined length. The divided parts of the positive voltage electrode 33 are arrayed in the same row (or column) and the divided parts of the negative voltage electrode 31 are arrayed in the same row (or column). The divided parts of the positive voltage electrode 33 in one row (or column) are arrayed to alternate with the divided parts of the negative voltage electrode 31 in one row (or column) (as shown in FIG. 13) or in the matrix form (as shown in FIG. 14). As illustrated in FIG. 15 or 16, the capacitive coupling electrodes 31 and 33 may be formed in a plurality of square or round flat plate-type area electrodes. As illustrated in FIG. 17, the capacitive coupling electrodes 31 and 33 may be formed in a post-type structure in a cylindrical shape. As illustrated in FIGS. 18 through 22, the capacitive coupling electrodes 31 and 33 may be formed in a flat plate-type spiral or concentric circular structure in which the capacitive coupling electrodes alternate with each other. In these structures, a plurality of the capacitive coupling electrodes 31 and 33 may comprise only one positive voltage electrode 33 and one negative voltage electrode 31.

As described above, a plurality of the capacitive coupling electrodes 31 and 33 may have one or more structures selected from the barrier-type structure, the flat plate-type structure, the protrusion-type structure, the cylindrical post-type structure, the concentric circular or ring structure, the spiral structure and the linear structure. Further, the positive voltage electrodes 33 and negative voltage electrodes 31 may have one or more array structures selected from the various array structures, such as the mutually alternating linear array structure, the matrix-type array structure, the mutually alternating spiral array structure and the mutually alternating concentric array structure. An insulating layer (not shown) may be formed between the capacitive coupling electrodes 31 and 33.

Again referring to FIG. 1, the supporting bed 12 to support the substrate to be processed is included inside the plasma reactor 10. The substrate supporting bed 12 is connected to bias power supply sources 42 and 43 and is biased. For example, the two bias power supply sources 42 and 43 supplying different radio frequency power are electrically connected to the substrate supporting bed 12 through an impedance matching device 44 so that the substrate supporting bed 12 is biased. The double bias structure of the substrate supporting bed 12 makes it easy to generate plasma inside the plasma reactor 10 and better improves the control of plasma ion energy, thereby improving the processing productivity. The substrate supporting bed 12 may be modified as a single bias structure. The supporting bed 12 may be modified as a structure having zero potential, with no supply of the bias power. Further, the substrate supporting bed 12 may include an electrostatic chuck. The substrate supporting bed 12 may further include a heater.

A plurality of the capacitive coupling electrodes 31 and 33 are driven by receiving the radio-frequency power generated from the main power supply source 40 through the impedance matching device 41 and the distribution circuit 50, thereby inducing the capacitively coupled plasma inside the plasma reactor 10. The main power supply source 40 may be formed by using a radio-frequency generator which is capable of controlling output power, without any separate impedance matching device. The distribution circuit 50 distributes the radio-frequency power provided from the main power supply source 40 to a plurality of the capacitive coupling electrodes 31 and 33 to be driven in parallel. According to an aspect, the distribution circuit 50 comprises a current balance circuit so that a current supplied to a plurality of the capacitive coupling electrodes 31 and 33 is automatically in balance in each electrode. The capacitively coupled plasma reactor is capable of uniformly generating large-area plasma by a plurality of the capacitive coupling electrodes 31 and 33. Furthermore, since the balance of a current is automatically performed in parallel driving a plurality of the capacitive coupling electrodes, the large-area plasma is more uniformly generated and maintained.

Figure 23:
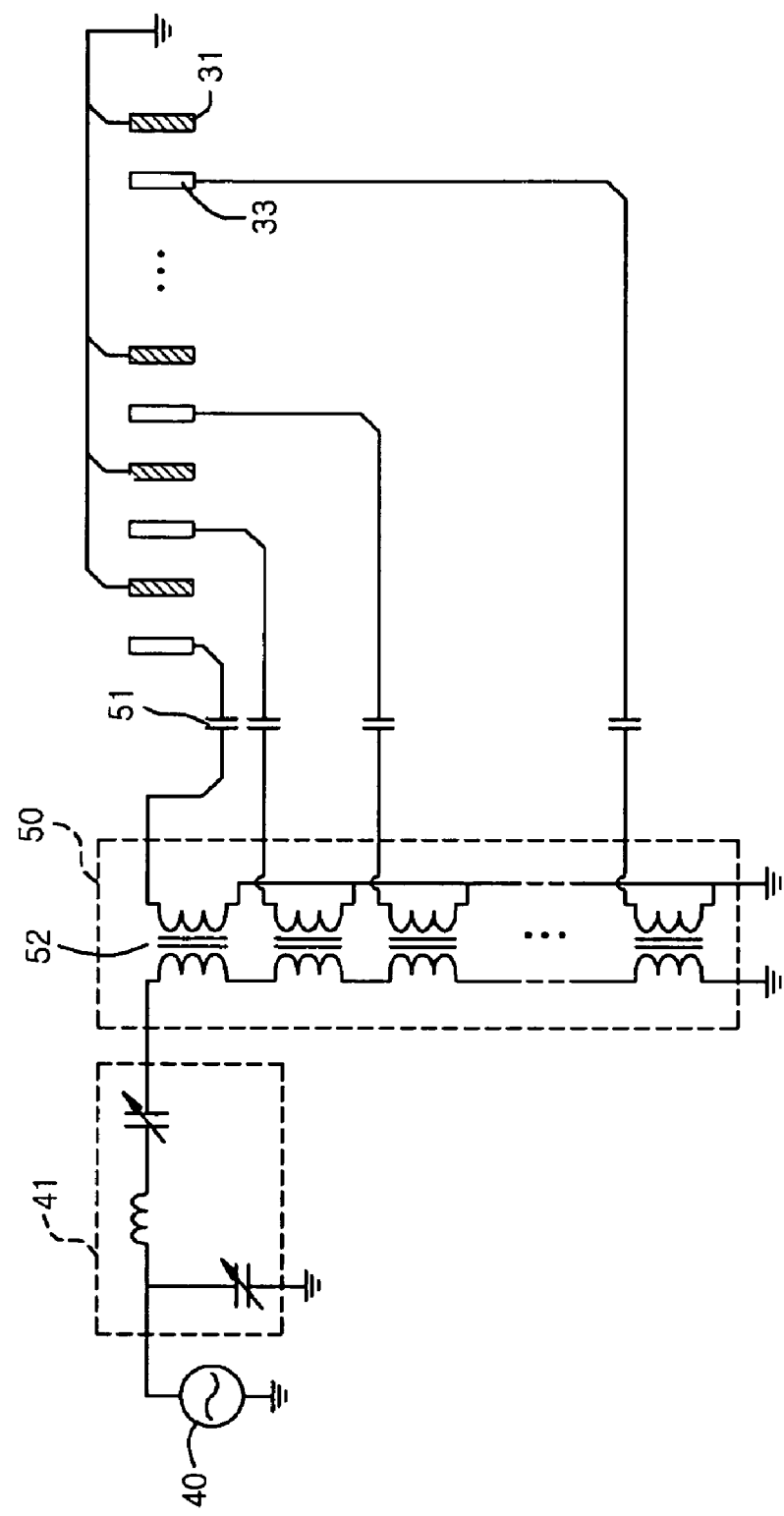
FIG. 23 illustrates an example of a distribution circuit comprising a current balance circuit.

FIG. 23 illustrates an example of the distribution circuit comprising the current balance circuit.

With reference to FIG. 23, the distribution circuit 50 includes a plurality of transformers 52 which parallel drives a plurality of the capacitive coupling electrodes 31 and 33 and performs the balance of a current. A first side of each transformer 52 is connected in series between ground and a power input terminal where radio-frequency is input. One end of a second side of each transformer 52 is connected to correspond to a plurality of the capacitive coupling electrodes 31 and 33 and the other end of the second side of each transformer 52 is commonly grounded. The transformers 52 equally divide the voltage between the power input terminal and the ground and output a number of the divided voltages to the corresponding positive voltage electrodes 33 among a plurality of the capacitive coupling electrodes 31 and 33. The negative voltage electrodes 31 among a plurality of the capacitive coupling electrodes 31 and 33 are commonly grounded.

Since a current flowing to the first side of each transformer 52 is same, the power supplied to each positive voltage electrode 33 is same. When any impedance among a plurality of the capacitive coupling electrodes 31 and 33 is changed to change an amount of the current, a plurality of the transformers 52 entirely interact to make the balance of a current. Therefore, the current supplied to a plurality of the capacitive coupling electrodes 31 and 33 is continuously and automatically controlled to be uniform with one another. In a plurality of the transformers 52, the winding rate of the first side to the second side is basically set as 1:1 but it may be varied.

The current balance circuit 50 described above may comprise a protection circuit (not shown) to prevent any excessive voltage of the transformers 52. The protection circuit prevents an excessive voltage of any one of the transformers 52 from increasing when the corresponding transformer is electrically open. According to an aspect, the protection circuit having this function may be realized by connecting a varistor to both ends of the first side of each transformer 52 or by using a positive voltage diode such as a Zener diode. The current balance circuit 50 may further comprise a compensation circuit, such as a compensation capacitor 51 to compensate a leakage current, in each transformer 52.

Figure 24:
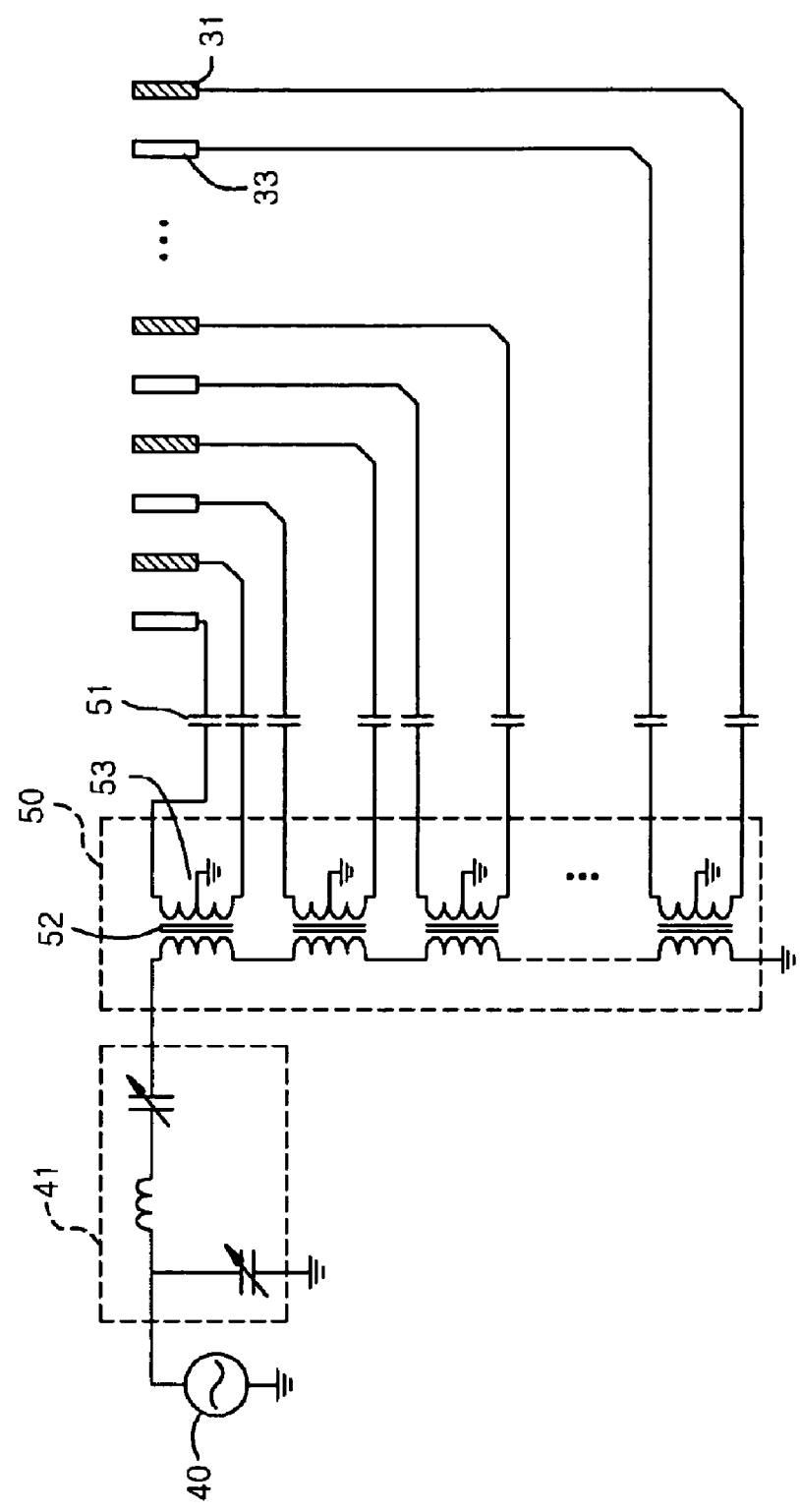
FIGS. 24 through 26 illustrate various modifications of the distribution circuit.
Figure 25:
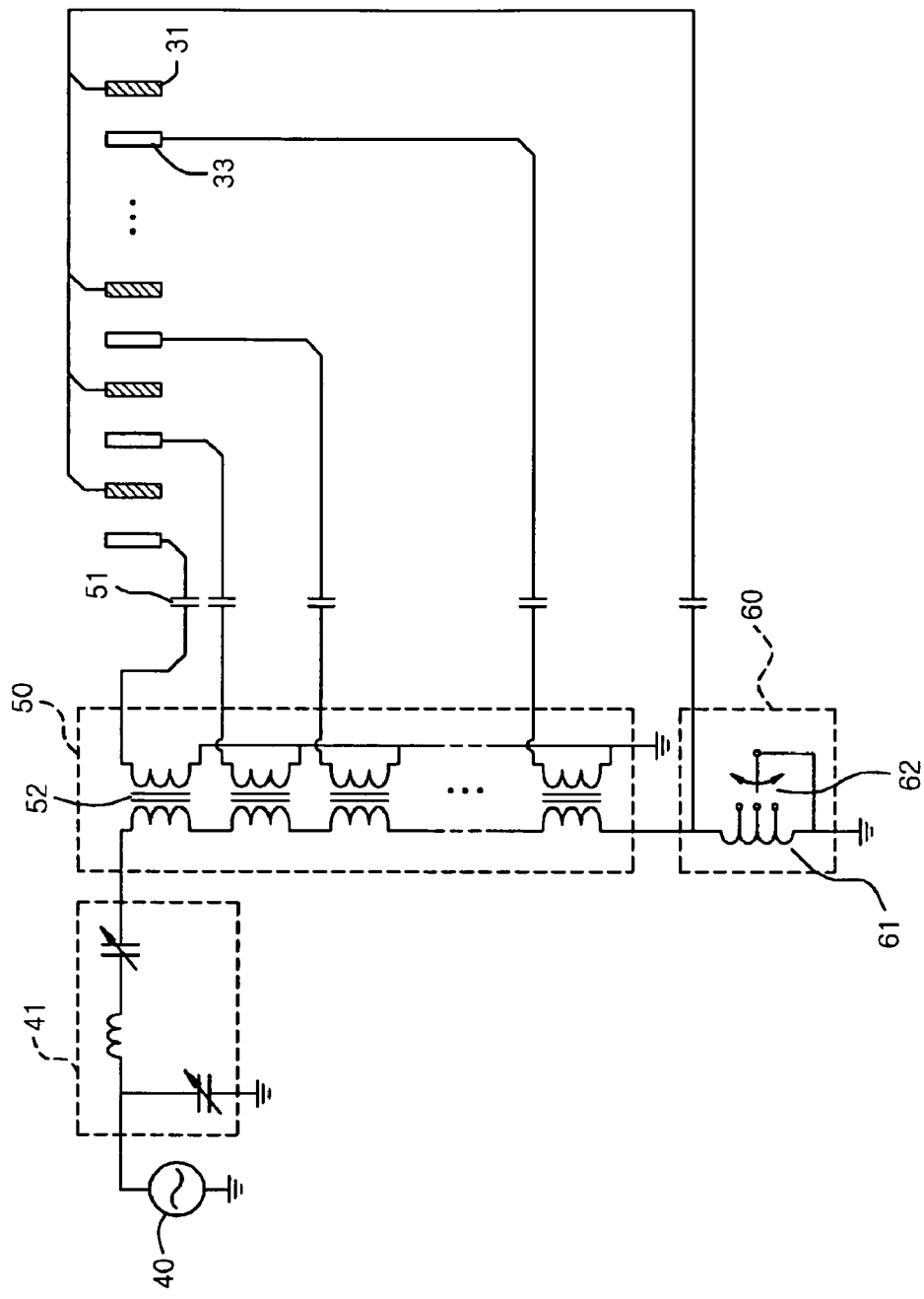
Figure 26:
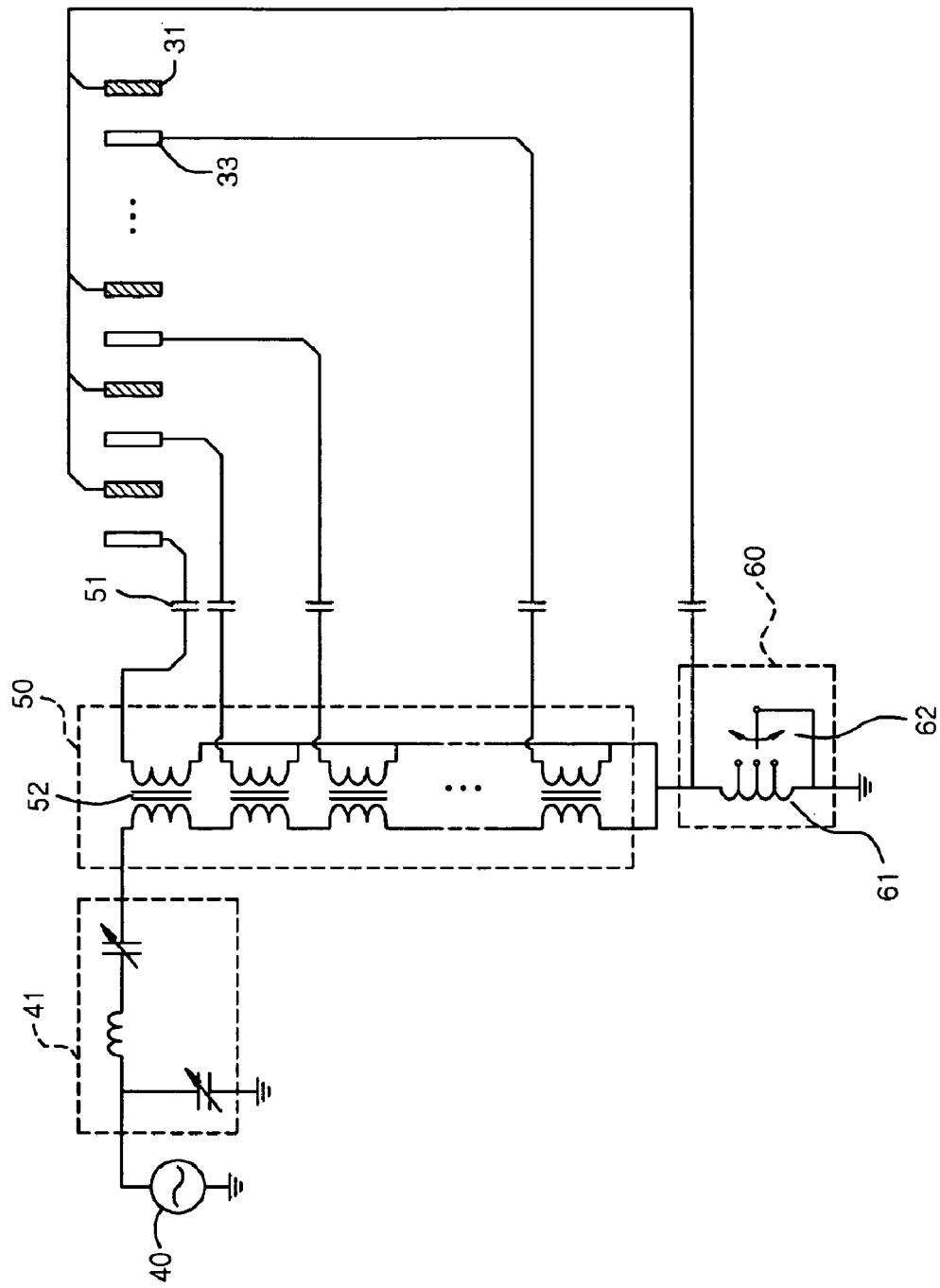

FIGS. 24 through 26 illustrate various modifications of the distribution circuit.

With reference to FIG. 24, in a modified current balance circuit 50, second sides of a plurality of the transformers 52 each include a grounded center tab, so that one end of each second part outputs a positive voltage and the other end thereof outputs a negative voltage. The positive voltage is provided to the positive voltage electrodes 33 of a plurality of the capacitive coupling electrodes, and the negative voltage is provided to the negative voltage electrodes 31 of a plurality of the capacitive coupling electrodes.

With reference to FIGS. 25 and 26, another modified current balance circuit may comprise a voltage level control circuit 60 which is capable of varying a current balance control range. The voltage level control circuit 60 comprises a coil 61 including multi tabs, and a multi tab switching circuit 62 to connect any one of the multi tabs to the ground. The voltage level control circuit 60 applies the voltage level varied depending on the switching position of the multi tab switching circuit 62 to the current balance circuit 50. The current balance circuit 50 varies a current balance control range by the voltage level determined by the voltage level control circuit 60.

Figure 27:
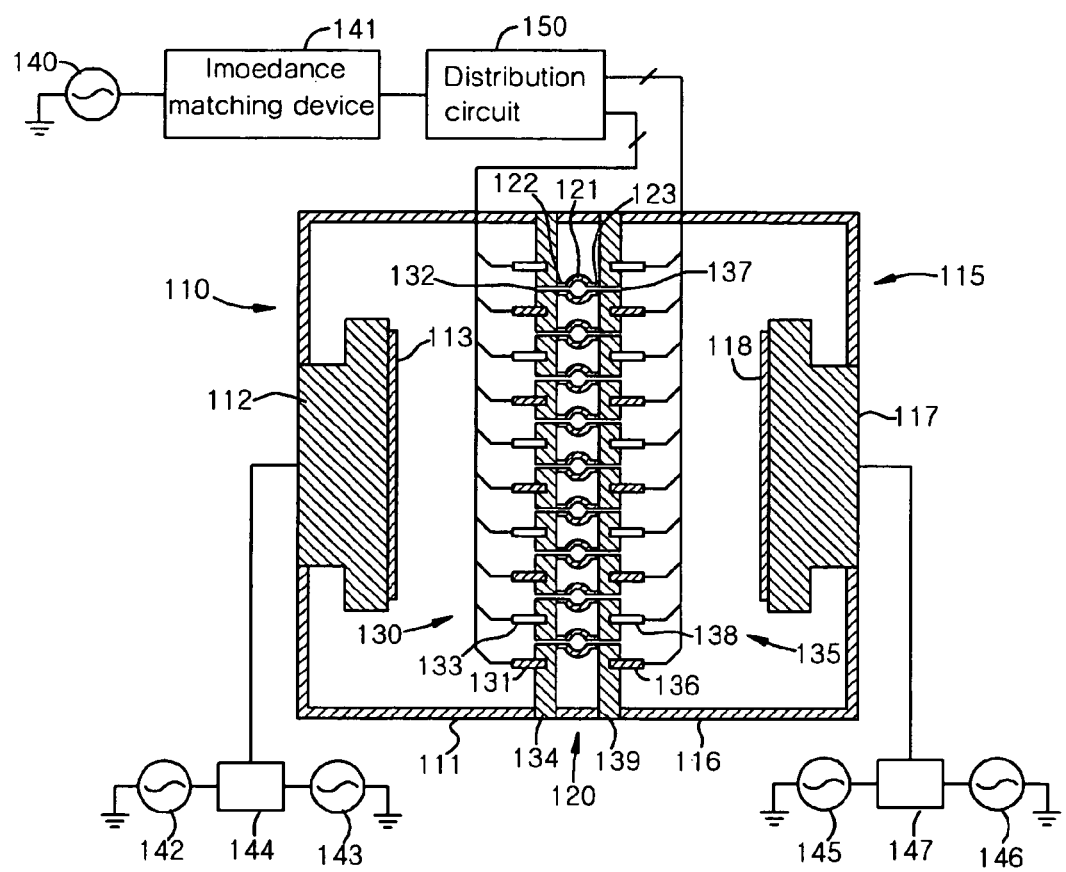
FIG. 27 is a sectional view illustrating a plasma reactor according to another exemplary embodiment.

FIG. 27 is a sectional view illustrating a plasma reactor according to another exemplary embodiment.

With reference to FIG. 27, a capacitively coupled plasma reactor according to an embodiment comprises first and second plasma reactors 110 and 115 formed in parallel, and first and second capacitive coupling electrode assemblies 130 and 135 to respectively induce plasma discharge inside the first and second plasma reactors 110 and 115. A gas supply unit 120 is positioned between the first and second capacitive coupling electrode assemblies 130 and 135. In the first and second plasma reactors 110 and 115, supporting beds 112 and 117 to receive substrates 113 and 118 to be processed are positioned at one sidewall, opposing to the first and second capacitive coupling electrode assemblies 130 and 135. the gas supply unit 120 is formed between the first and second capacitive coupling electrode assemblies 130 and 135 and supplies a gas provided from a gas supply source (not shown) to the insides of the first and second plasma reactors 110 and 115, through gas injection holes 132 and 137 of the first and second capacitive coupling electrode assemblies 130 and 135. Radio-frequency power generated from a main power supply source 140 is supplied to a plurality of capacitive coupling electrodes 131, 133, 136 and 138 included in the first and second capacitive coupling electrode assemblies 130 and 135, through an impedance matching device 141 and a distribution circuit 150, thereby inducing capacitively coupled plasma inside the first and second plasma reactors 110 and 115. Plasma processing on the substrates 113 and 118 to be processed is performed by the plasma generated inside the first and second plasma reactor 110 and 115.

The first and second plasma reactors 110 and 115 each comprise reactor bodies 111 and 116 and supporting beds 112 and 117 on which the substrates 113 and 118 to be processed are placed. The reactor bodies 111 and 116 may be made of a metal material, such as aluminum, stainless steel or copper. The reactor bodies 111 and 116 may be made of a coated metal, for example, anodically processed aluminum or nickel-plated aluminum. The reactor bodies 111 and 116 may be made of a refractory metal. Alternatively, the reactor bodies 111 and 116 may be entirely or partially made of an electrically insulating material, such as quartz or ceramic. As described above, the reactor bodies 111 and 116 can be manufactured by using any materials suitable to perform an intended plasma process. The reactor bodies 111 and 116 may have a structure suitable for uniform generation of plasma, for example, a round structure, a square structure or any other shape structure, depending on the substrates 113 and 118 to be processed.

Examples of the substrates 113 and 118 to be processed may include a wafer substrate, a glass substrate, a plastic substrate and the like to manufacture various devices, for example, a semiconductor device, a display device, a solar battery and the like. The first and second plasma reactors 110 and 115 are connected to a vacuum pump (not shown). The first and second plasma reactors 110 and 115 may have a common exhaust structure by using a single vacuum pump or may have their respective exhaust structures by using separate vacuum pumps. In this embodiment, the first and second plasma reactors 110 and 115 respectively perform the plasma processing on the substrates 113 and 118 to be processed at low pressure below atmospheric pressure. However, the capacitively coupled plasma reactor may be used as atmospheric pressure plasma processing systems of performing the plasma processing on the substrates to be processed at the atmospheric pressure.

Figure 28:
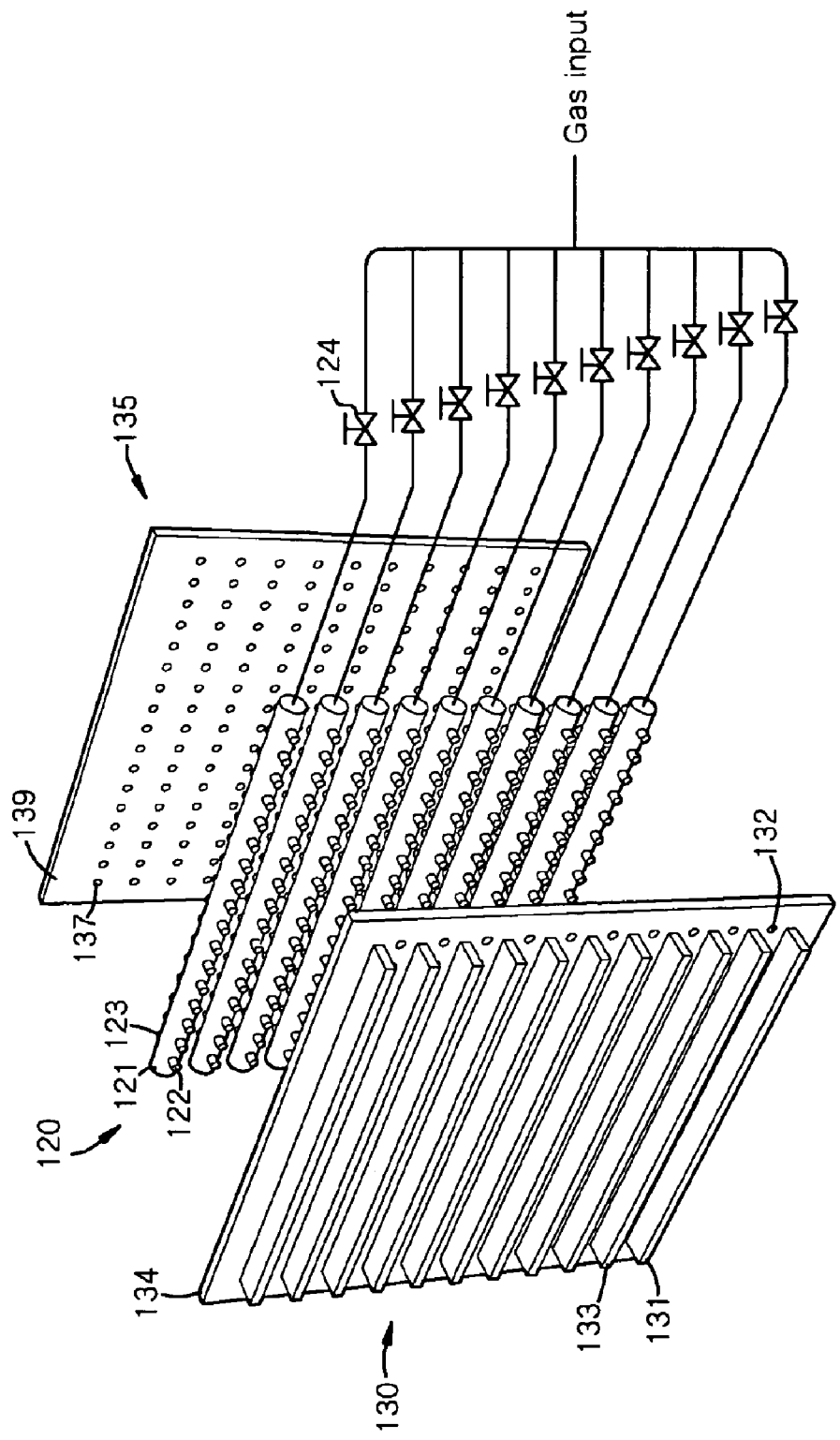
FIG. 28 is a perspective view illustrating capacitive coupling electrode assemblies and a gas supply unit.

FIG. 28 is a perspective view illustrating the capacitive coupling electrode assemblies 130 and 135 and the gas supply unit 120.

With reference to FIG. 28, the gas supply unit 120 is positioned between the first and second capacitive coupling electrode assemblies 130 and 135. The gas supply unit 120 comprises a plurality of gas supply conduits 121 connected to a gas supply source (not shown). Each gas supply conduit 121 independently comprises a control valve 124 to control gas supply flux. A plurality of the gas supply conduits 121 may be configured so that the gas supply flux thereof is indiscriminately controlled. Alternatively, a plurality of the gas supply conduits 121 may be configured so that the gas supply flux thereof is entirely and individually controlled.

Each gas supply conduit 121 includes a plurality of gas injection ports 122 and 123 which are connected to a plurality of corresponding gas injection holes 132 and 137 of electrode mounting plates 134 and 139. The gas provided from the gas supply source is evenly distributed through a plurality of the gas supply conduits 121 and is evenly injected to the insides of the first and second plasma reactors 110 and 115 through a plurality of the gas injection ports 122 and 123 and a plurality of the gas injection holes 132 and 137 corresponding to the gas injection ports 122 and 123. A plurality of the gas supply conduits 121 may be configured to comprise gas supply channels divided into two groups. A plurality of the gas supply conduits 121 may be configured to separately supply different gases, thereby improving the uniformity of the plasma processing.

Figure 29:
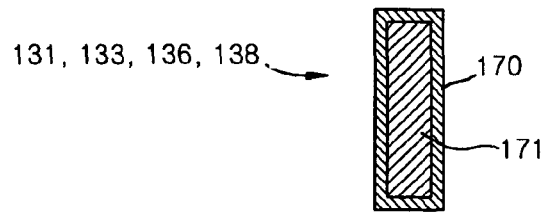
FIG. 29 is a sectional view illustrating a capacitive coupling electrode.

The first and second capacitive coupling electrode assemblies 130 and 135 comprise a plurality of the capacitive coupling electrodes 131, 133, 136 and 138 to induce the discharge of the capacitively coupled plasma inside the first and second plasma reactors 110 and 115. A plurality of the capacitive coupling electrodes 131, 133, 136 and 138 are respectively mounted on the electrode mounting plates 134 and 139. The electrode mounting plates 134 and 138 are positioned to oppose to the supporting beds 112 and 117 of the first and second plasma reactors 110 and 115. A plurality of the capacitive coupling electrodes 131, 133, 136 and 138 are arrayed horizontally or vertically to be installed on the electrode mounting plates 134 and 139. A plurality of the capacitive coupling electrodes 131, 133, 136 and 138 have a structure in that a plurality of positive voltage electrodes 133 and 138 are arrayed in parallel to alternate with a plurality of negative voltage electrodes 131 and 136. A plurality of the capacitive coupling electrodes 131 and 133 have a linear barrier-type structure in that they protrude from the electrode mounting plate 134. As illustrated in FIG. 29, a plurality of the capacitive coupling electrodes 131, 133, 136 and 138 may be formed of a conductive region 171 and an insulating region 170 covering the outer surface of the conductive region 171. Alternatively, a plurality of the capacitive coupling electrodes 131, 133, 136 and 138 may comprise only the conductive region 171. The shapes and array structures of the capacitive coupling electrodes 131, 133, 136 and 138 may be variously modified, as described later.

The electrode mounting plate 134 comprises a plurality of the gas injection holes 132 and the electrode mounting plate 139 comprises a plurality of the gas injection holes 137. The gas injection holes 132 are positioned between a plurality of the capacitive coupling electrodes 131 and 133 so as to be spaced apart from one another at a predetermined distance, and the gas injection holes 137 are positioned between a plurality of the capacitive coupling electrodes 136 and 138 so as to be spaced apart from one another at a predetermined distance. Each of the electrode mounting plates 134 and 139 may be made of a metal material, a non-metal material, or a mixture thereof. When the electrode mounting plates 134 and 139 are composed of the metal materials, each electrically insulating structure is formed between the capacitive coupling electrodes 131 and 133 and between the capacitive coupling electrodes 136 and 138. Each of the electrode mounting plates 134 and 139 is installed to form one sidewall of each of the reactor bodies 111 and 116 but it may be installed, along the wall surfaces of both sides of the ceiling and bottom of each of the reactor bodies 111 and 116, to increase the plasma processing efficiency. Each of the electrode mounting plates 134 and 139 may be installed, along one side wall of each of the reactor bodies 111 and 116 and the wall surface of both sides of the ceiling and bottom of each of the reactor bodies 111 and 116. Each of the electrode mounting plates 134 and 139 may comprise a cooling channel (not shown) or a heating channel (not shown) to suitably control a temperature.

FIGS. 30 through 36 are sectional views of capacitive coupling electrode assemblies, illustrating various modified examples of capacitive coupling electrodes.

Figure 30:
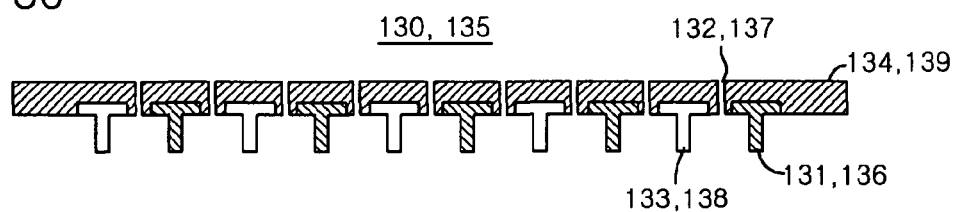
FIGS. 30 through 36 are sectional views of capacitive coupling electrode assemblies, illustrating various modified examples of capacitive coupling electrodes.
Figure 31:
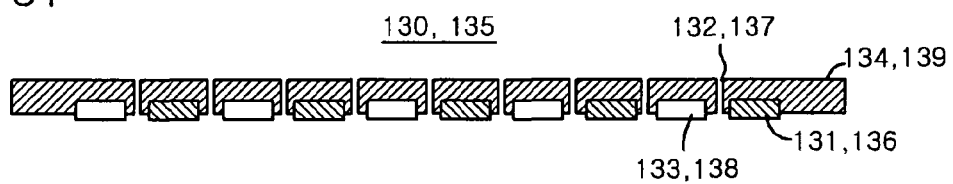
Figure 32:
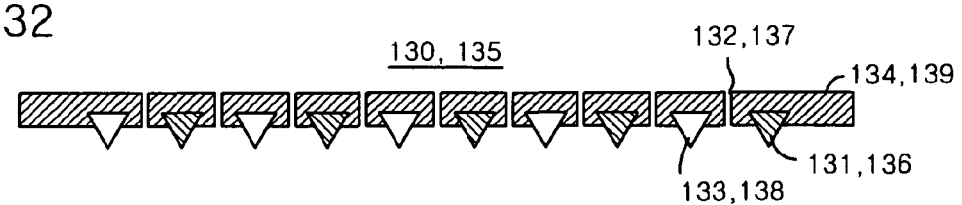
Figure 33:
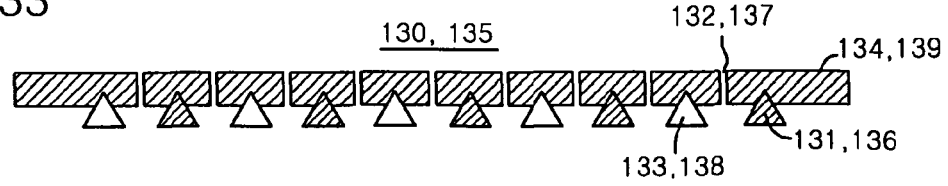
Figure 34:
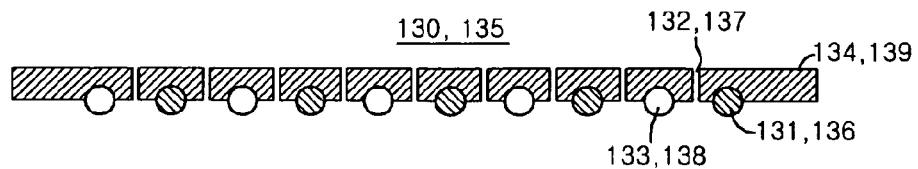
Figure 35:
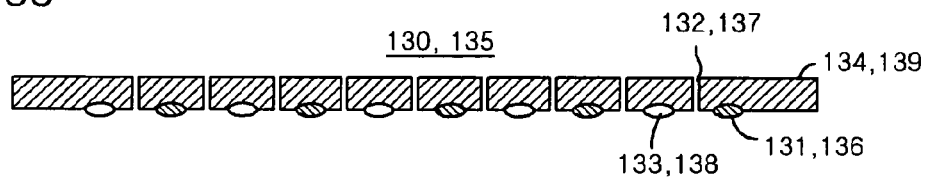
Figure 36:
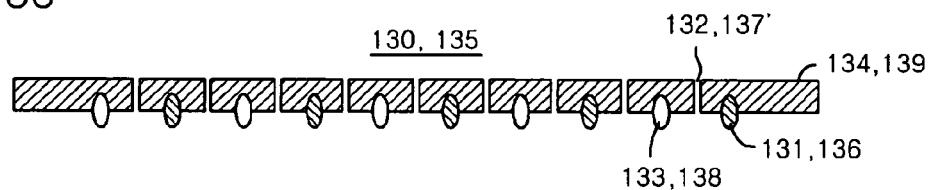

As illustrated in FIG. 30, each of the capacitive coupling electrodes 131, 133, 136 and 138 may have a barrier-type structure and its section may be in a 'T' shape structure. In this structure, each capacitive coupling electrode may be installed in the manner that its head part is fixed onto the electrode mounting plate 134 or upside down. As illustrated in FIG. 31, the section of each of the capacitive coupling electrodes 131, 133, 136 and 138 may be in a flat plate-type structure having a narrow width. As illustrated in FIG. 32 or 33, the section of each of the capacitive coupling electrodes 131, 133, 136 and 138 may be in a triangle structure or an inverted triangle structure. Or, as illustrated in FIGS. 34 through 36, the section of each of the capacitive coupling electrodes 131, 133, 136 and 138 may be in a cylindrical rod shape structure, an oval structure being wider in a horizontal direction or an oval structure being wider in a vertical direction. As described above, the sections of the capacitive coupling electrodes 131, 133, 136 and 138 may be various in shape, such as a round, oval or polygonal shape.

FIGS. 37 through 47 are bottom plan views of the capacitive coupling electrode assemblies, illustrating various modifications of a plan structure and a plan array structure of capacitive coupling electrodes.

Figure 37:
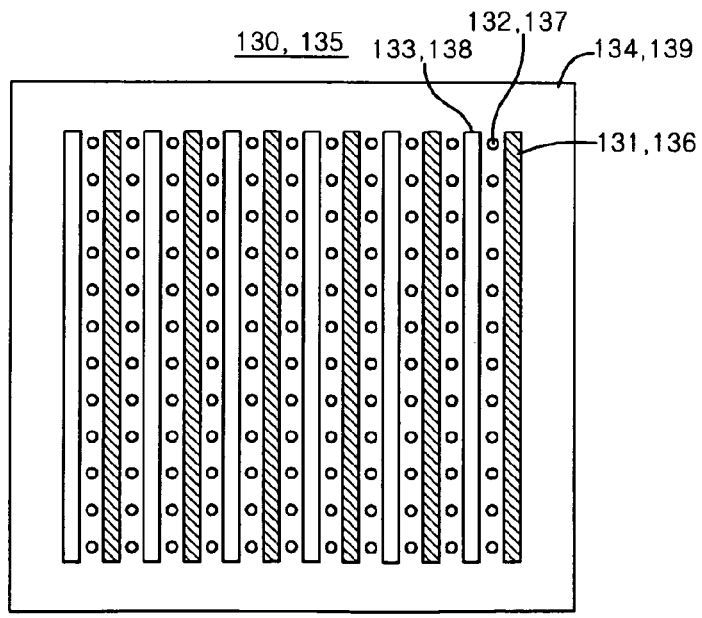
FIGS. 37 through 47 are bottom plan views of the capacitive coupling electrode assemblies, illustrating various modifications of a plan structure and a plan array structure of capacitive coupling electrodes.

As illustrated in FIG. 37, a plurality of the positive voltage electrodes 133 and 138 and a plurality of the negative voltage electrodes 131 and 136 forming a plurality of the capacitive coupling electrodes 131, 133, 136 and 138 are alternately arrayed. A plurality of the gas injection holes 132 may be positioned between a plurality of the capacitive coupling electrodes 131 and 133 and the gas injection holes 137 may be positioned between a plurality of the capacitive coupling electrodes 136 and 138.

Figure 38:
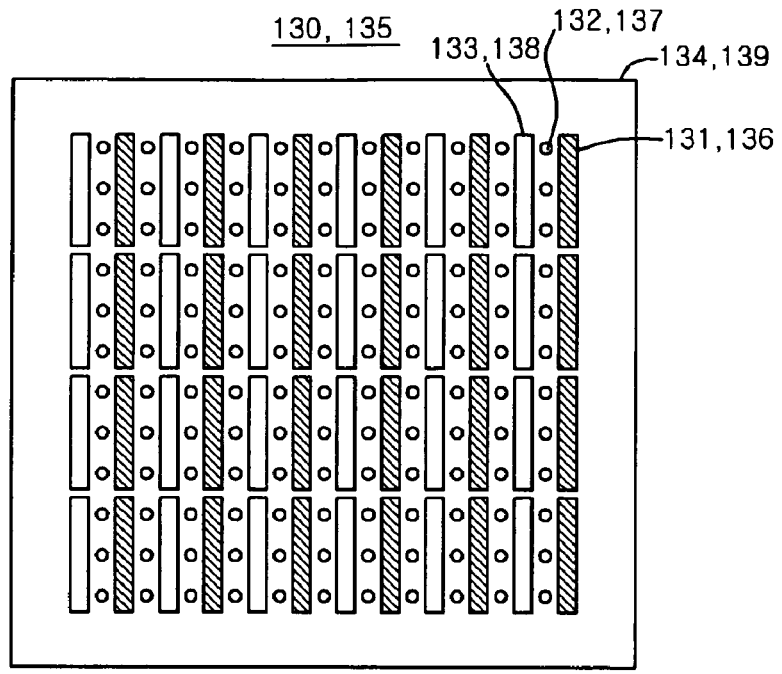
Figure 39:
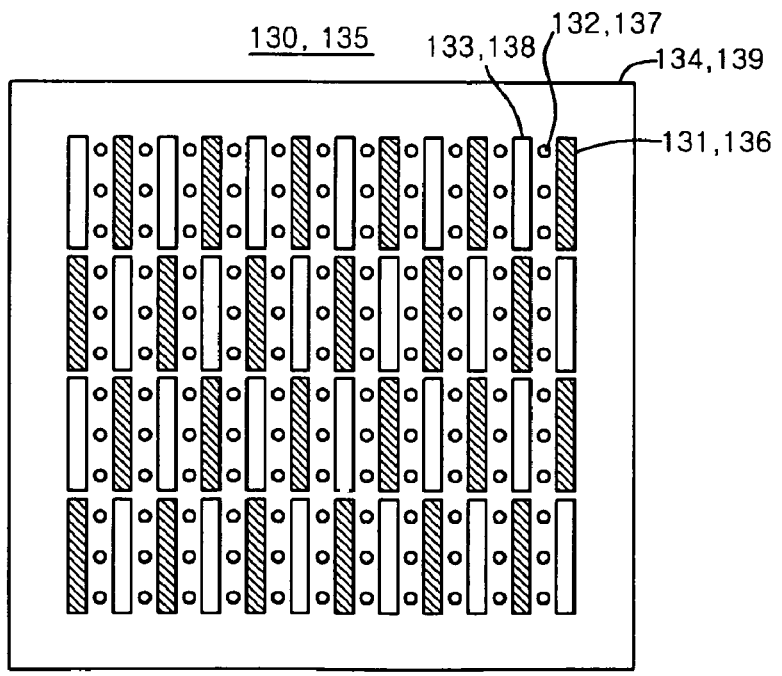
Figure 40:
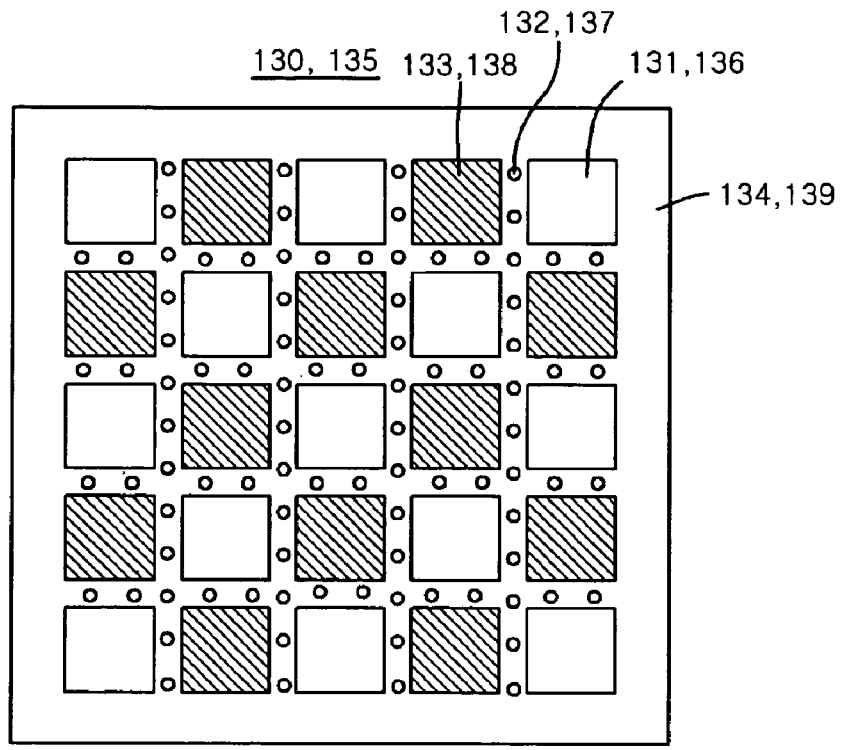
Figure 41:
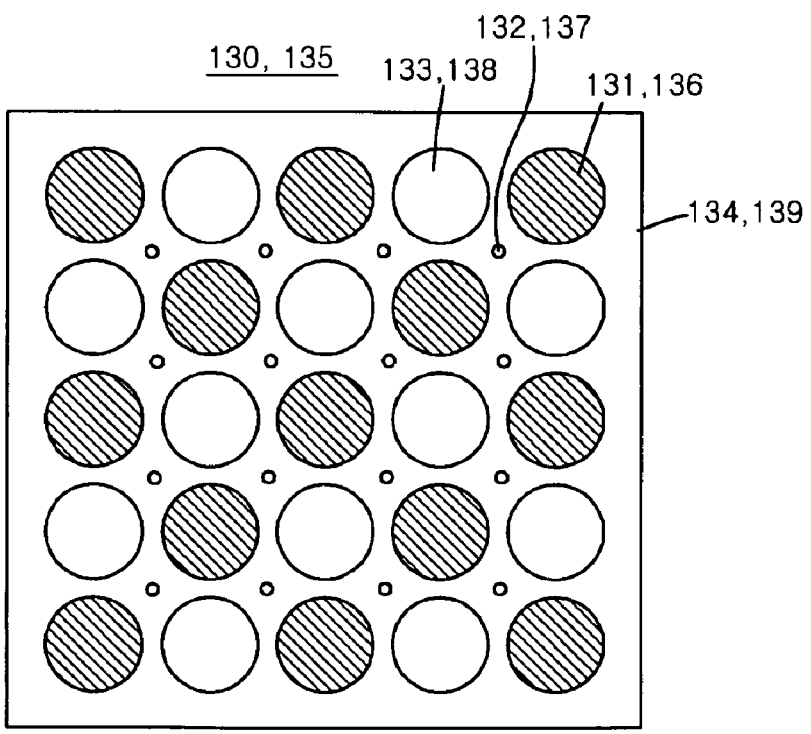
Figure 42:
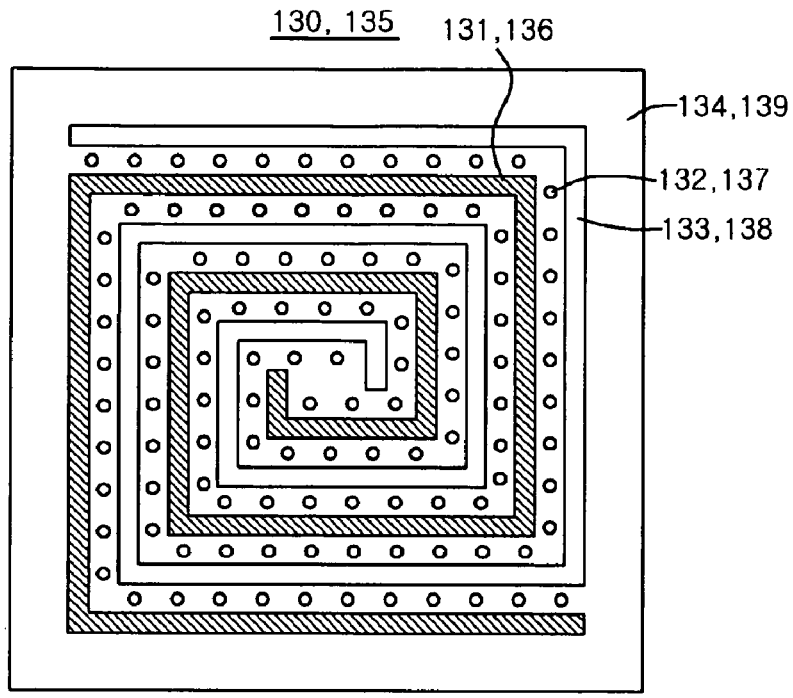
Figure 43:
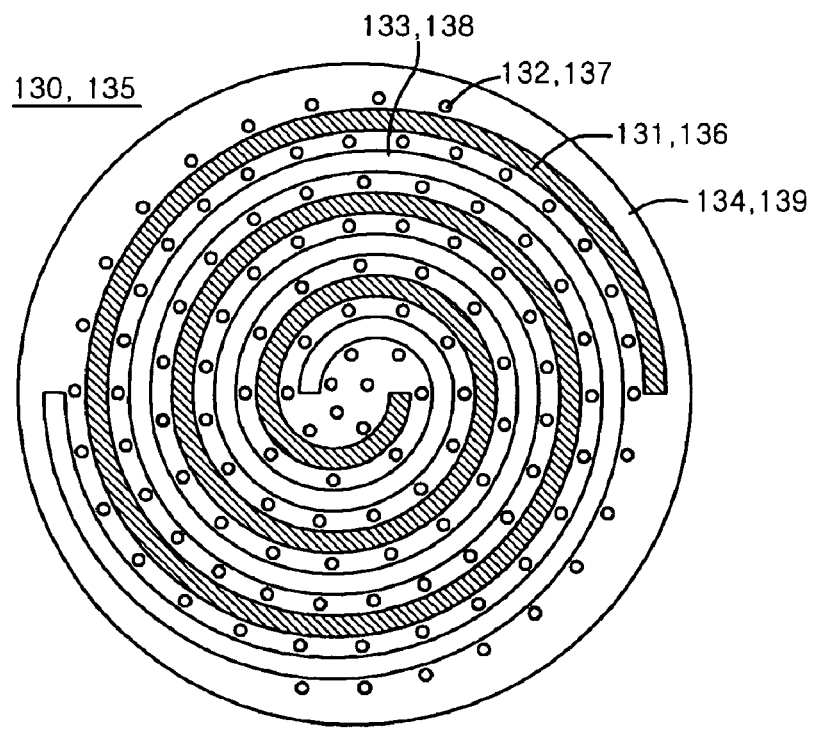
Figure 44:
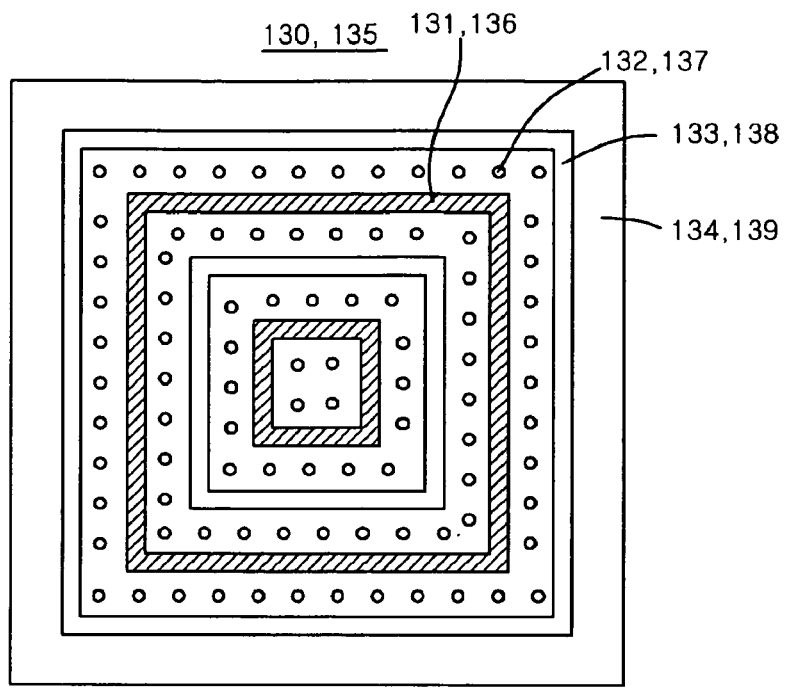
Figure 45:
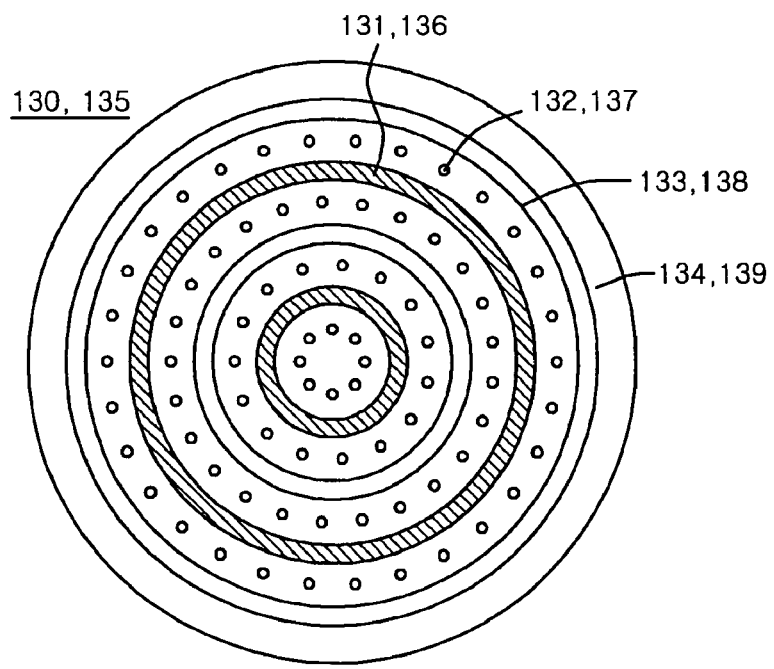
Figure 46:
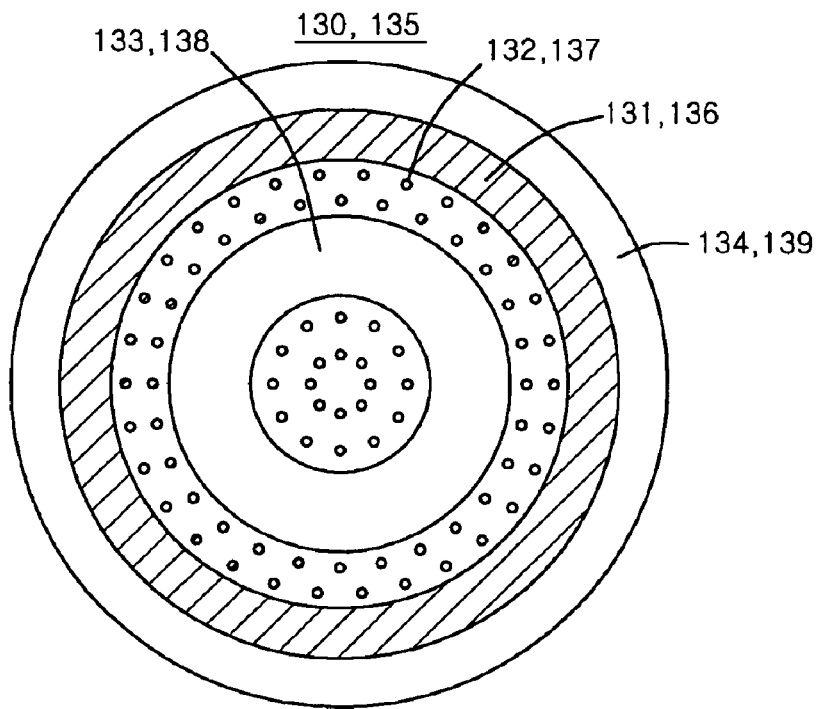
Figure 47:
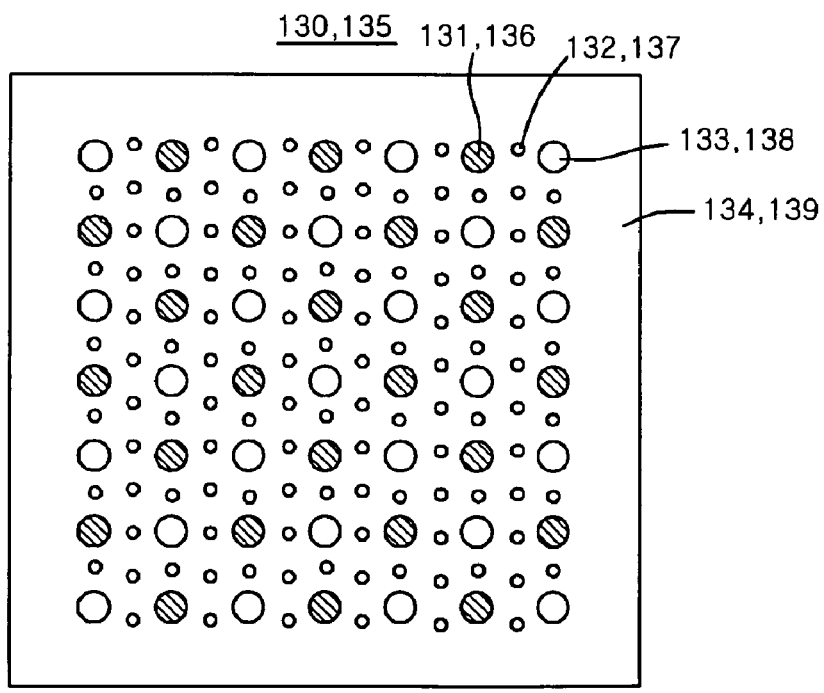

As illustrated in FIG. 38 or 39, each of the positive voltage electrodes 133 and 138 is divided into parts by a predetermined length and each of the negative voltage electrodes 131 and 136 is divided into parts by a predetermined length. The divided parts of each of the positive voltage electrode 133 and 138 are arrayed in the same row (or column) and the divided parts of each of the negative voltage electrodes 131 and 136 are arrayed in the same row (or column). The divided parts of each of the positive voltage electrodes 133 and 138 in one row (or column) are arrayed to alternate with the divided parts of each of the negative voltage electrodes 131 and 136 in one row (or column) (as shown in FIG. 38) or in the matrix form (as shown in FIG. 39). As illustrated in FIG. 40 or 41, the capacitive coupling electrodes 131, 133, 136 and 138 may be formed in a plurality of square or round flat plate-type area electrodes. As illustrated in FIG. 42, the capacitive coupling electrodes 131, 133, 136 and 138 may be formed in a post-type structure like a cylindrical shape. As illustrated in FIGS. 43 through 48, the capacitive coupling electrodes 131, 133, 136 and 138 may be formed in a flat plate-type spiral or concentric circular structure in which the capacitive coupling electrodes 131 and 133 alternate with each other and the capacitive coupling electrodes 136 and 138 alternate with each other. In these structures, a plurality of the capacitive coupling electrodes 131 and 133 may comprise only one positive voltage electrode 133 and one negative voltage electrode 131, a plurality of the capacitive coupling electrodes 136 and 138 may comprise only one positive voltage electrode 138 and one negative voltage electrode 136.

As described above, a plurality of the capacitive coupling electrodes 131, 133, 136 and 138 may have one or more structures selected from the barrier-type structure, the flat plate-type structure, the protrusion-type structure, the cylindrical post-type structure, the concentric circular or ring structure, the spiral structure and the linear structure. Further, a plurality of the positive voltage electrodes 133 and a plurality of the negative voltage electrodes 131 may have one or more array structures selected from the various array structures, such as the mutually alternating linear array structure, the matrix-type array structure, the mutually alternating spiral array structure and the mutually alternating concentric array structure. In the same manner, a plurality of the positive voltage electrodes 138 and a plurality of the negative voltage electrodes 136 may have one or more array structures selected from the various array structures, such as the mutually alternating linear array structure, the matrix-type array structure, the mutually alternating spiral array structure and the mutually alternating concentric array structure. An insulating layer (not shown) may be formed between the capacitive coupling electrodes 131 and 133 and between the capacitive coupling electrodes 136 and 138.

Again referring to FIG. 27, each of the supporting beds 112 and 117 to support each of the substrates 113 and 118 to be processed is included inside each of the first and second plasma reactors 110 and 115. The substrate supporting bed 112 is connected to bias power supply sources 142 and 143 and is biased, and the substrate supporting bed 117 is connected to bias power supply sources 145 and 146 and is biased. For example, the two bias power supply sources 142 and 143 supplying different radio frequency power are electrically connected to the substrate supporting bed 112 through an impedance matching device 144 so that the substrate supporting bed 112 is biased, and the two bias power supply sources 145 and 146 supplying different radio frequency power are electrically connected to the substrate supporting bed 117 through an impedance matching device 147 so that the substrate supporting bed 117 is biased.

The double bias structure of each of the substrate supporting beds 112 and 117 makes it easy to generate plasma inside each of the first and second plasma reactors 110 and 115 and better improves the control of plasma ion energy, thereby improving the processing productivity. Each of the substrate supporting beds 112 and 117 may be modified as a single bias structure. Each of the supporting beds 112 and 117 may be modified as a structure having zero potential, with no supply of the bias power. Further, each of the substrate supporting beds 112 and 117 may include an electrostatic chuck. Each of the substrate supporting beds 112 and 117 may further include a heater.

A plurality of the capacitive coupling electrodes 131, 133, 136 and 138 are driven by receiving the radio-frequency power generated from the main power supply source 140 through the impedance matching device 141 and the distribution circuit 150, thereby inducing the capacitively coupled plasma inside the first and second plasma reactors 110 and 115. The main power supply source 140 may be formed by using a radio-frequency generator which is capable of controlling output power, without any separate impedance matching device. The distribution circuit 150 distributes the radio-frequency power provided from the main power supply source 140 to a plurality of the capacitive coupling electrodes 131, 133, 136 and 138 to be driven in parallel. According to an aspect, the distribution circuit 150 comprises a current balance circuit so that a current supplied to a plurality of the capacitive coupling electrodes 131, 133, 136 and 138 is automatically in balance in each electrode. The capacitively coupled plasma reactor is capable of uniformly generating large-area plasma by a plurality of the capacitive coupling electrodes 131, 133, 136 and 138. Furthermore, since the balance of a current is automatically performed in parallel driving a plurality of the capacitive coupling electrodes, the large-area plasma is more uniformly generated and maintained.

Figure 48:
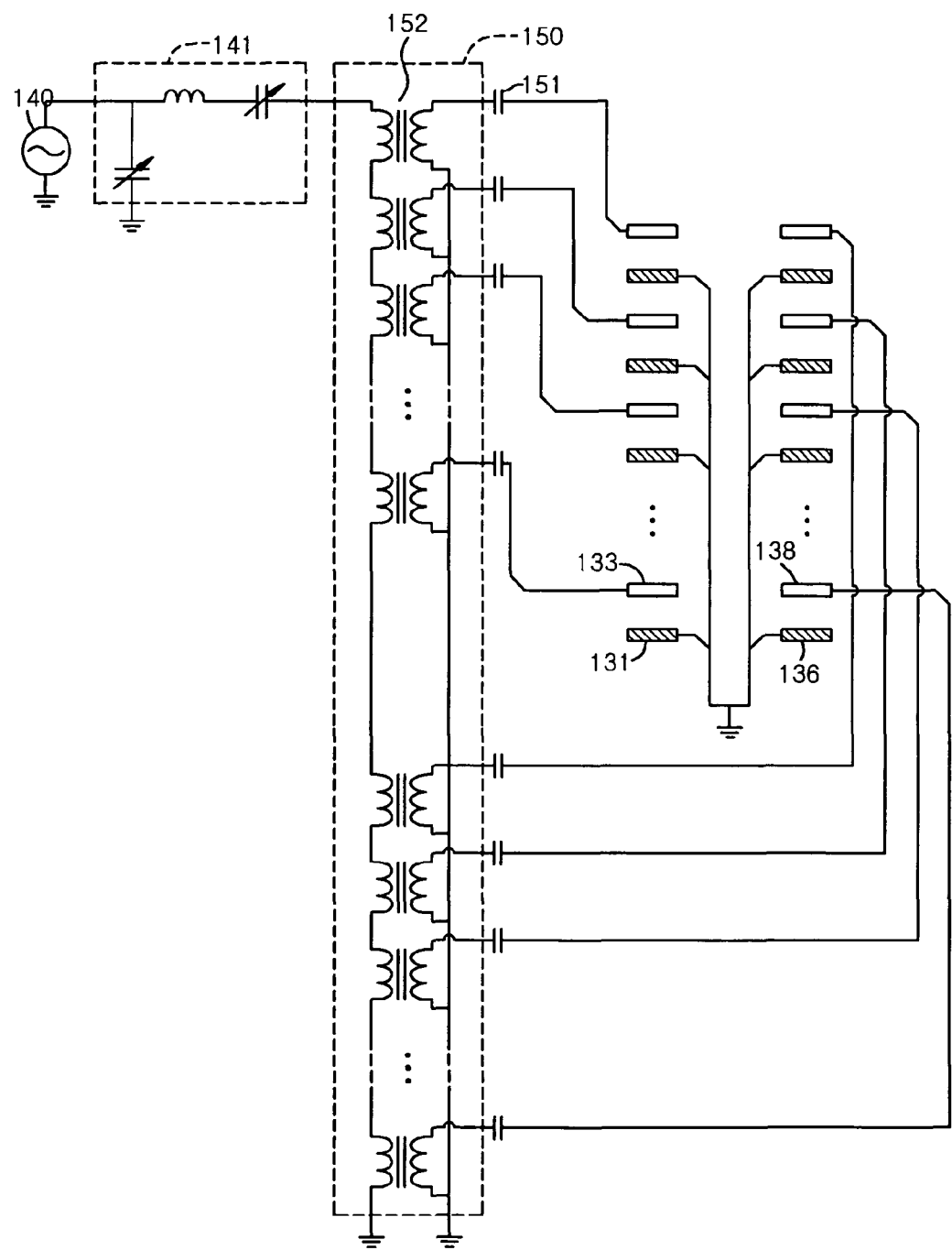
FIG. 48 illustrates an example of a distribution circuit comprising a current balance circuit.

FIG. 48 illustrates an example of the distribution circuit comprising the current balance circuit.

With reference to FIG. 48, the distribution circuit 150 includes a plurality of transformers 152 which parallel drives a plurality of the capacitive coupling electrodes 131, 133, 136 and 138 and performs the balance of a current. A first side of each transformer 152 is connected in series between ground and a power input terminal where radio-frequency is input. One end of a second side of each transformer 152 is connected to correspond to a plurality of the capacitive coupling electrodes 131, 133, 136 and 138 and the other end of the second side of each transformer 152 is commonly grounded. The transformers 152 equally divide the voltage between the power input terminal and the ground and output a number of the divided voltages to the corresponding positive voltage electrodes 133 and 138 among a plurality of the capacitive coupling electrodes 131, 133, 136 and 138. The negative voltage electrodes 131 and 136 among a plurality of the capacitive coupling electrodes 131, 133, 136 and 138 are commonly grounded.

Since a current flowing to the first side of each transformer 152 is same, the power supplied to each of the positive voltage electrodes 133 and 138 is same. When any impedance among a plurality of the capacitive coupling electrodes 131, 133, 136 and 138 is changed to change an amount of the current, a plurality of the transformers 152 entirely interact to make the balance of a current. Therefore, the current supplied to a plurality of the capacitive coupling electrodes 131, 133, 136 and 138 is continuously and automatically controlled to be uniform with one another. In a plurality of the transformers 152, the winding rate of the first side to the second side is basically set as 1:1 but it may be varied.

The current balance circuit 150 described above may comprise a protection circuit (not shown) to prevent any excessive voltage of the transformers 152. The protection circuit prevents an excessive voltage of any one of the transformers 152 from increasing when the corresponding transformer is electrically open. According to an aspect, the protection circuit having this function may be realized by connecting a varistor to both ends of the first side of each transformer 152 or by using a positive voltage diode such as a Zener diode. The current balance circuit 150 may further comprise a compensation circuit, such as a compensation capacitor 151 to compensate a leakage current, in each transformer 152.

FIGS. 49 through 54 illustrate various modifications of the distribution circuit.

Figure 49:
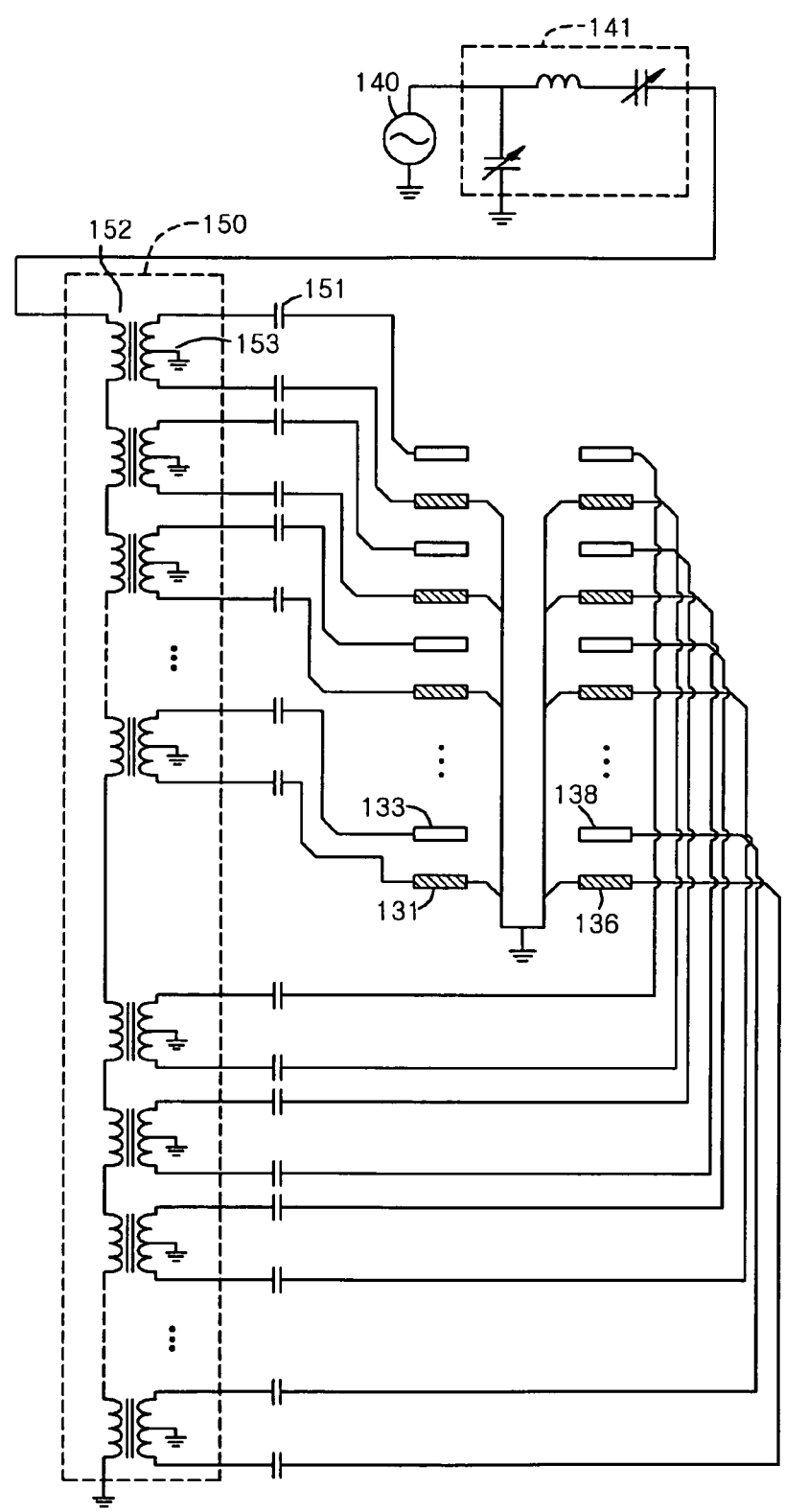
FIGS. 49 through 54 illustrate various modifications of the distribution circuit.

With reference to FIG. 49, in a modified current balance circuit 150, second sides of a plurality of the transformers 152 each include a grounded center tab, so that one end of each second part outputs a positive voltage and the other end thereof outputs a negative voltage. The positive voltage is provided to the positive voltage electrodes 133 and 138 of a plurality of the capacitive coupling electrodes, and the negative voltage is provided to the negative voltage electrodes 131 and 136 of a plurality of the capacitive coupling electrodes.

Figure 50:
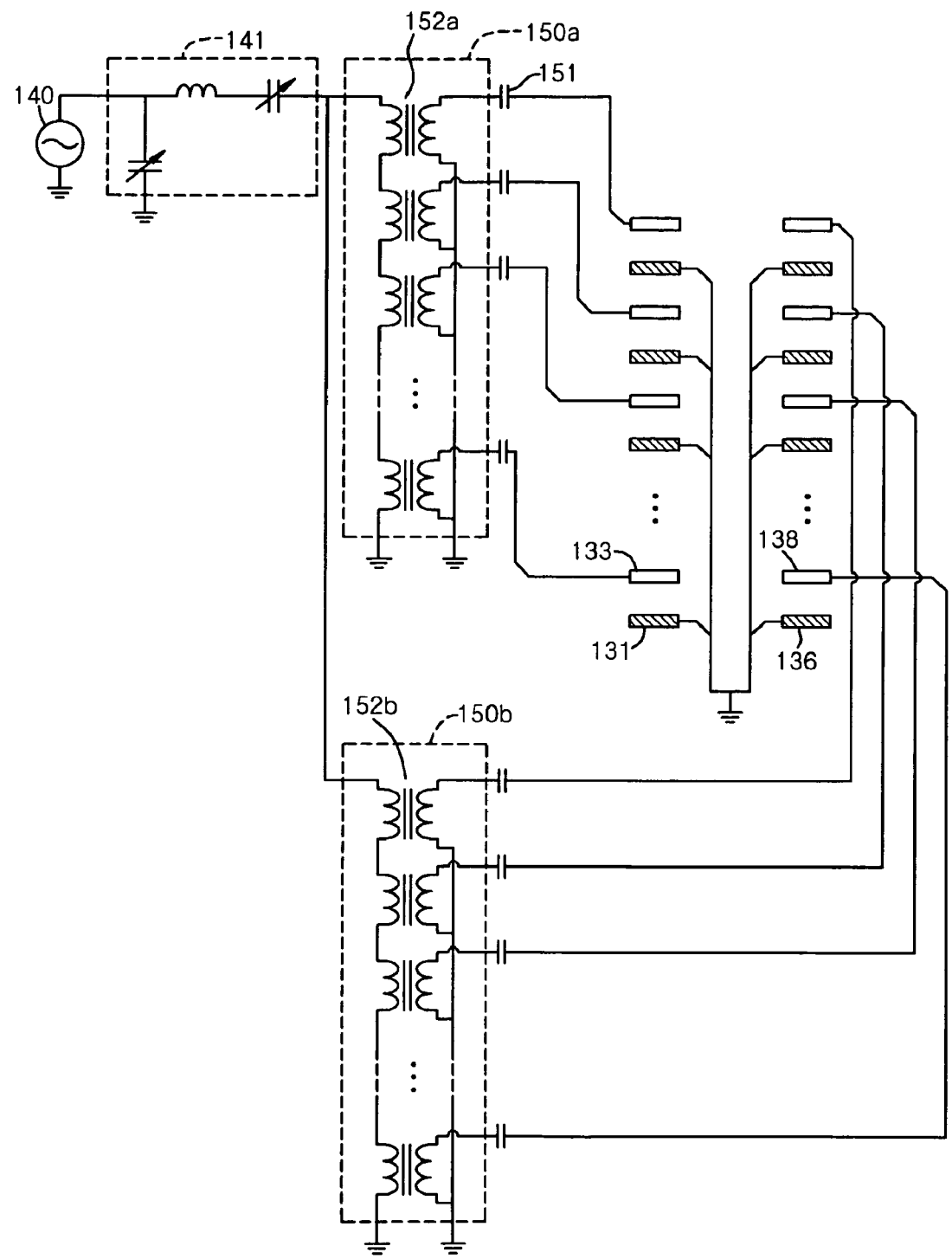

With reference to FIG. 50, another modified current balance circuit 150a may comprise a first current balance circuit 150a and another modified current balance circuit 150b may comprise a second current balance circuit 150b. The first and second current balance circuits 150a and 150b are parallel connected to the impedance matching device 141. The first current balance circuit 150a is configured to correspond to a plurality of the capacitive coupling electrodes 131 and 133 of the first capacitive coupling electrode assembly 130, and the second current balance circuit 150b is configured to correspond to a plurality of the capacitive coupling electrodes 136 and 138 of the second capacitive coupling electrode assembly 135.

Figure 51:
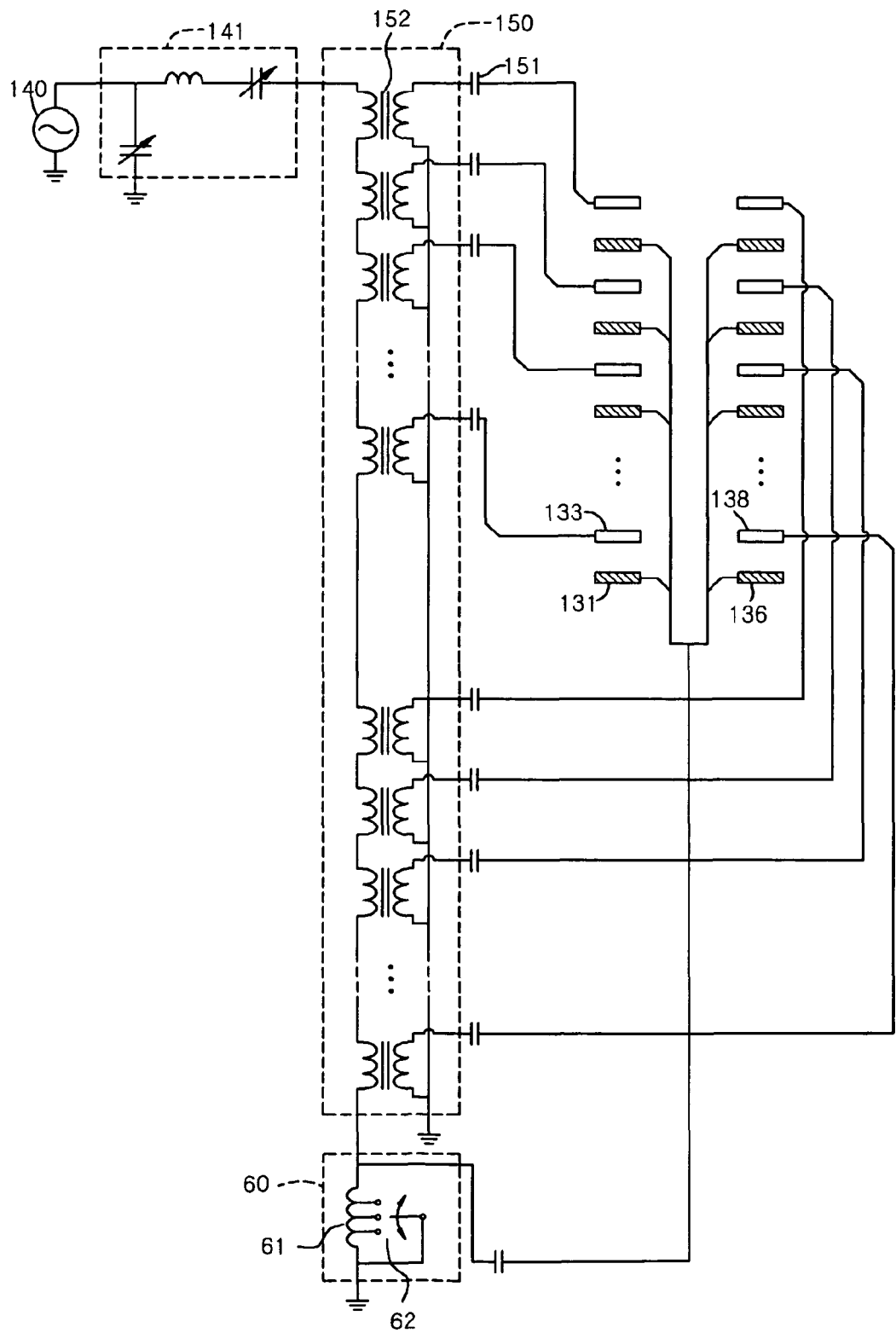
Figure 52:
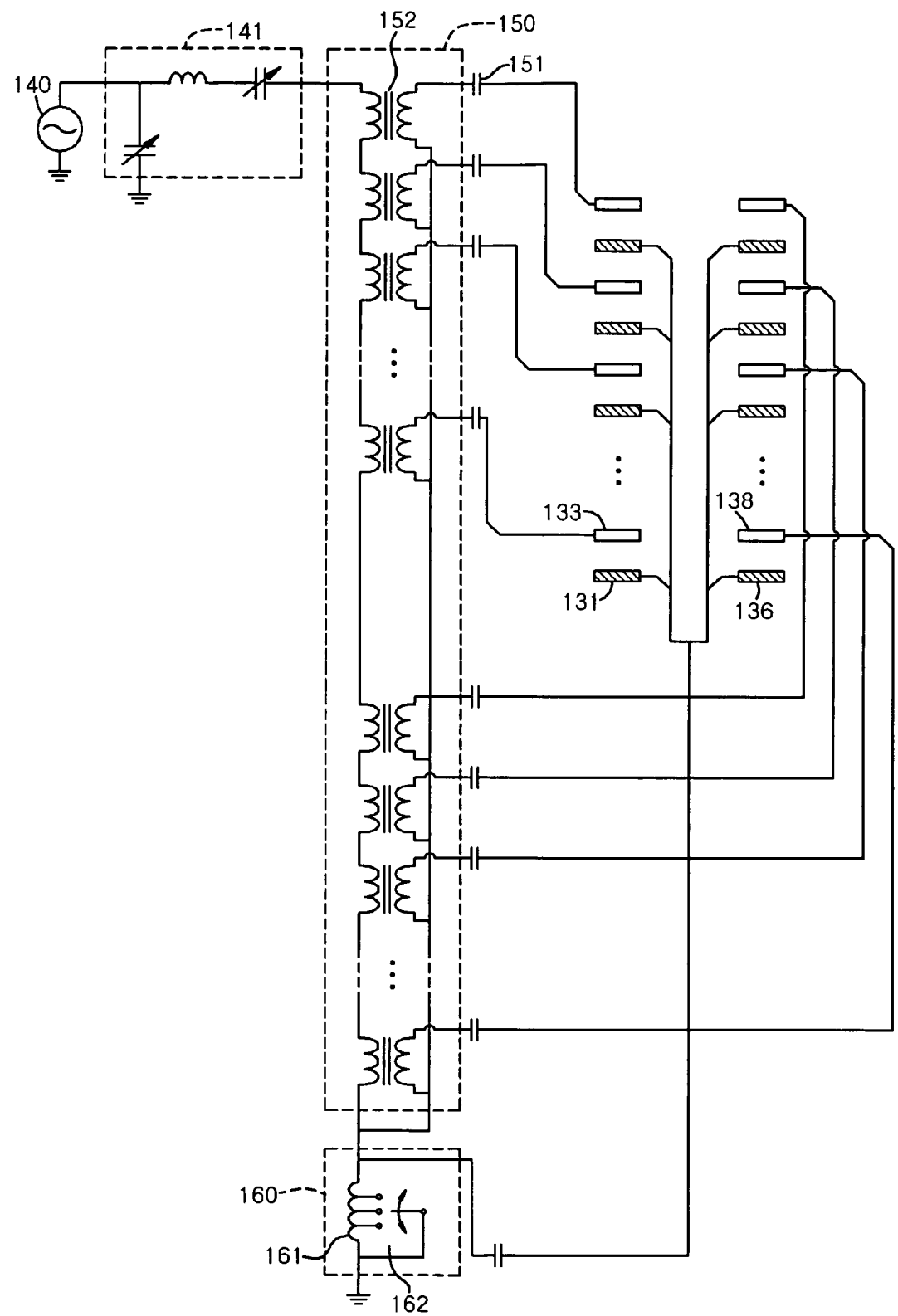
Figure 53:
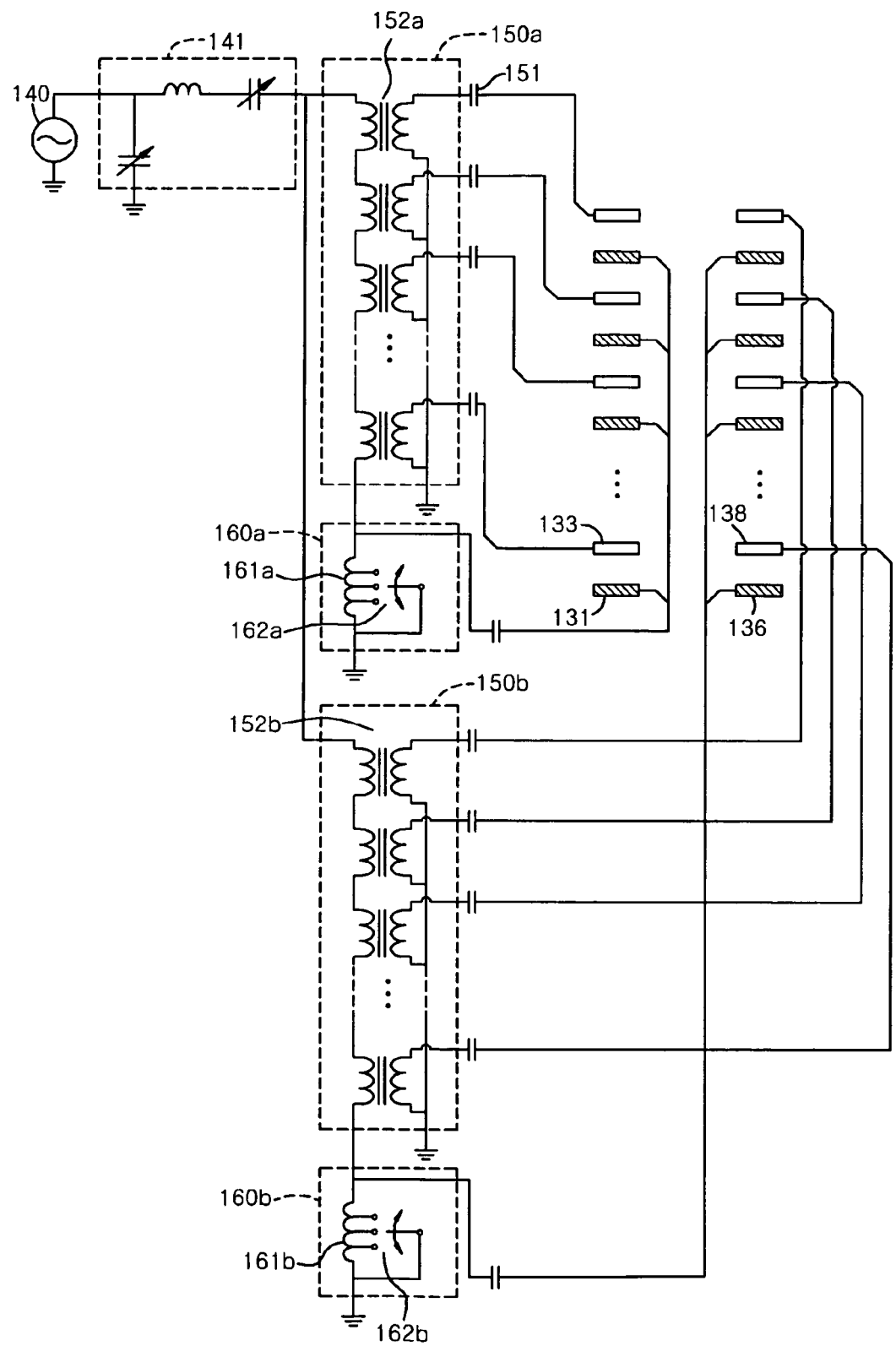
Figure 54:
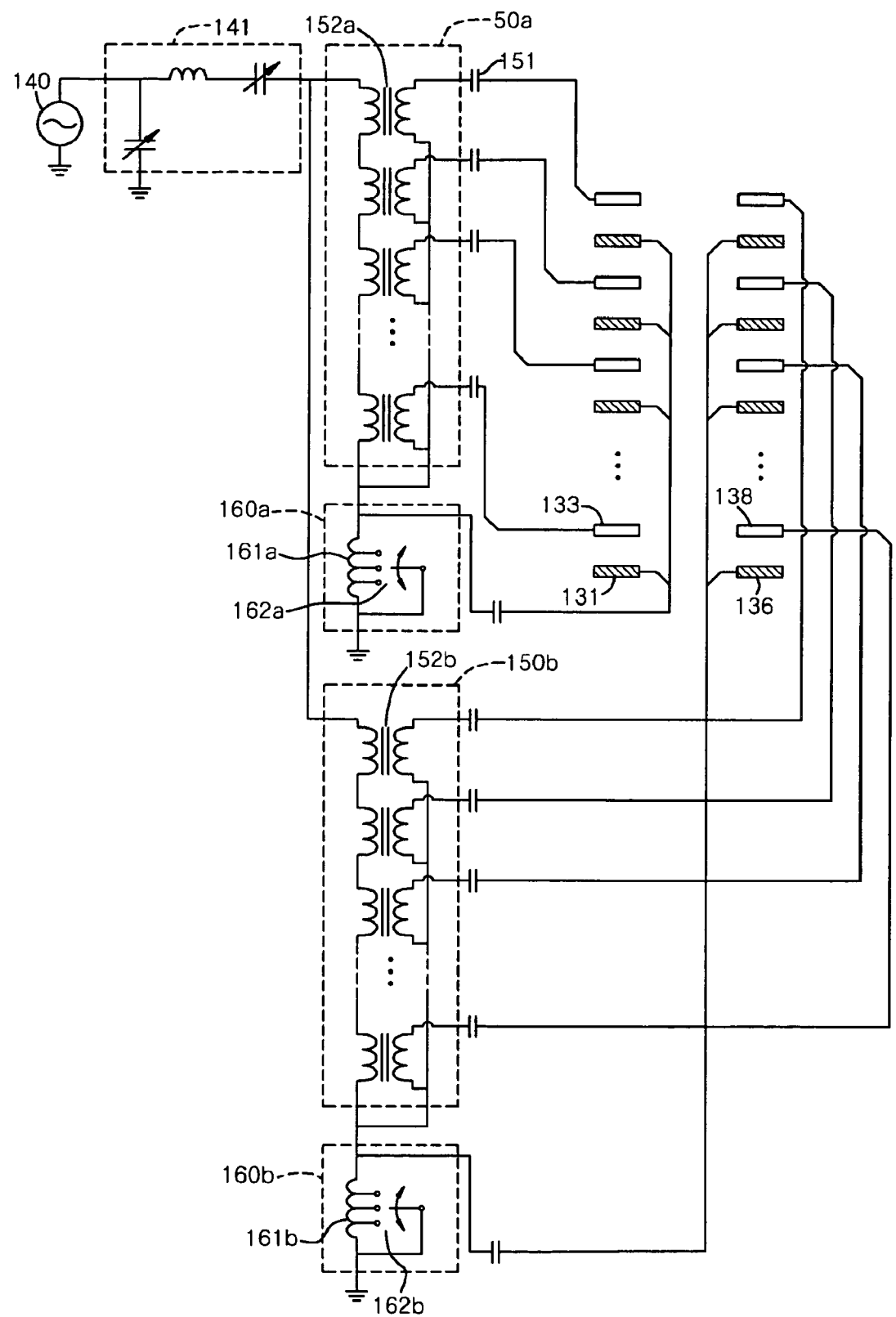

With reference to FIGS. 51 and 52, another modified current balance circuit 150 may comprise a voltage level control circuit 160 which is capable of varying a current balance control range. The voltage level control circuit 160 comprises a coil 161 including multi tabs, and a multi tab switching circuit 162 to connect any one of the multi tabs to the ground. The voltage level control circuit 160 applies the voltage level varied depending on the switching position of the multi tab switching circuit 162 to the current balance circuit 150. The current balance circuit 150 varies a current balance control range by the voltage level determined by the voltage level control circuit 160. Further, as illustrated in FIGS. 53 and 54, in the case where the first and second current balance circuits 150a and 150b are included, the voltage level control circuits 160a and 160b may be respectively included in the same manner.

According to certain plasma reactor described above, large-area plasma is uniformly generated by a plurality of capacitive coupling electrodes. According to an aspect, since the current is automatically in balance when parallel driving a plurality of capacitive coupling electrodes, the capacitive coupling of the capacitive coupling electrodes is uniformly controlled to uniformly generate high-density plasma. According to another aspect, since a plurality of capacitive coupling electrodes are used, the large-area plasma is easily performed. According to another aspect, since two or more large-area substrates are simultaneously processed, a substrate processing rate per equipment area is improved.

A capacitively coupled plasma reactor according to certain embodiments described above may be applied to a plasma processing process to form a variety of thin films, such as semiconductor integrated circuit fabrication, flat display manufacturing and solar power battery manufacturing. The plasma reactor according to according to certain embodiments described above is capable of uniformly generating large-area plasma by using a plurality of capacitive coupling electrodes. According to an aspect, an electric current is automatically in balance when parallel driving a plurality of capacitive coupling electrodes so that large-area plasma is more uniformly generated and maintained.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A capacitively coupled plasma reactor comprising:
a plasma reactor;
a capacitive coupling electrode assembly including a plurality of capacitive coupling electrodes, to induce plasma discharge inside the plasma reactor;
a main power supply source to supply radio-frequency power; and
a distribution circuit to receive the radio-frequency power supplied from the main power supply source and to distribute the received radio-frequency power to the plurality of capacitive coupling electrodes,
wherein the distribution circuit comprises a current balance circuit, and
wherein the current balance circuit comprises a plurality of transformers.

2. The capacitively coupled plasma reactor according to claim 1, further comprising:
an impedance matching device positioned between the main power supply source and the distribution circuit, to perform impedance matching.

3. The capacitively coupled plasma reactor according to claim 1, wherein the current balance circuit is adapted to control balance of a current supplied to the plurality of capacitive coupling electrodes.

4. The capacitively coupled plasma reactor according to claim 3, wherein the current balance circuit parallel drives the plurality of capacitive coupling electrodes, and
the plurality of transformers balance the current.

5. The capacitively coupled plasma reactor according to claim 4, wherein the plurality of transformers have first sides connected in series between a ground and a power input terminal in which the radio-frequency is input, and second sides connected to the plurality of corresponding capacitive coupling electrodes.

6. The capacitively coupled plasma reactor according to claim 5, wherein the second sides of the plurality of transformers each comprise grounded center tabs, one end of each second side outputs a positive voltage and the other end thereof outputs a negative voltage, and the positive voltage is provided to a positive voltage electrode of the plurality of capacitive coupling electrodes and the negative voltage is provided to a negative voltage electrode of the plurality of capacitive coupling electrodes.

7. The capacitively coupled plasma reactor according to claim 3, wherein the current balance circuit comprises a voltage level control circuit capable of varying a current balance control range.

8. The capacitively coupled plasma reactor according to claim 3, wherein the current balance circuit comprises a compensation circuit to compensate a leakage current.

9. The capacitively coupled plasma reactor according to claim 3, wherein the current balance circuit comprises a protection circuit to prevent any damage by an excessive voltage.

10. The capacitively coupled plasma reactor according to claim 1, wherein the plurality of capacitive coupling electrodes comprise a conductive region and an insulating region.

11. The capacitively coupled plasma reactor according to claim 1, wherein the capacitive coupling electrode assembly comprises an insulating layer positioned between the plurality of capacitive coupling electrodes.

12. The capacitively coupled plasma reactor according to claim 1, wherein the capacitive coupling electrode assembly comprises an electrode mounting plate on which the plurality of capacitive coupling electrodes are mounted.

13. The capacitively coupled plasma reactor according to claim 12, wherein the electrode mounting plate comprises a plurality of gas injection holes and a gas supply unit to supply a gas to the inside of the plasma reactor through the gas injection holes.

14. The capacitively coupled plasma reactor according to claim 1, wherein the plasma reactor comprises a supporting bed inside, and the supporting bed on which a substrate to be processed is placed is biased or not biased.

15. The capacitively coupled plasma reactor according to claim 14, wherein the supporting bed is biased by a single frequency power or two or more different frequency power.

16. The capacitively coupled plasma reactor according to claim 14, wherein the supporting bed comprises an electrostatic chuck.

17. The capacitively coupled plasma reactor according to claim 14, wherein the supporting bed comprises a heater.

18. The capacitively coupled plasma reactor according to claim 1, wherein the plurality of capacitive coupling electrodes comprises a plurality of positive voltage electrodes and a plurality of negative voltage electrodes, and the positive voltage electrodes and the negative voltage electrodes have one or more array structures selected from a mutually alternating linear array structure, a matrix-type array structure, a mutually alternating spiral array structure and a mutually alternating concentric array structure.

19. The capacitively coupled plasma reactor according to claim 18, wherein the positive voltage electrodes and the negative voltage electrodes have one or more structures selected form a barrier-type structure, a flat plate-type structure, a protrusion-type structure, a cylindrical post-type structure, a ring-shape structure, a spiral structure and a linear structure.

20. A capacitively coupled plasma reactor comprising:
a first plasma reactor;
a second plasma reactor;
a first capacitive coupling electrode assembly including a plurality of capacitive coupling electrodes, to induce plasma discharge inside the first plasma reactor;
a second capacitive coupling electrode assembly including a plurality of capacitive coupling electrodes, to induce plasma discharge inside the second plasma reactor;
a main power supply source to supply radio-frequency power; and
a distributor circuit to receive the radio-frequency power supplied from the main power supply source and to distribute the received radio-frequency power to the plurality of capacitive coupling electrodes of the first and second capacitive coupling electrode assemblies,
wherein the distributor circuit comprises a current balance circuit, and
wherein the current balance circuit comprises a plurality of transformers.

21. The capacitively coupled plasma reactor according to claim 20, further comprising:
an impedance matching device positioned between the main power supply source and the distributor circuit, to perform impedance matching.

22. The capacitively coupled plasma reactor according to claim 20, wherein the current balance circuit controls a balance of a current supplied to the plurality of capacitive coupling electrodes of the first and second capacitive coupling electrode assemblies.

23. The capacitively coupled plasma reactor according to claim 22,
wherein the current balance circuit parallel drives the plurality of capacitive coupling electrodes of the first and second capacitive coupling electrode assemblies, and
the plurality of transformers balance the current.

24. The capacitively coupled plasma reactor according to claim 23, wherein the plurality of transformers have first sides connected in series between a ground and a power input terminal in which the radio-frequency is input, and second sides connected to the plurality of corresponding capacitive coupling electrodes of the first and second capacitive coupling electrode assemblies.

25. The capacitively coupled plasma reactor according to claim 24, wherein the second sides of the plurality of transformers each comprise grounded center tabs, one end of each second side outputs a positive voltage and the other end thereof outputs a negative voltage, and the positive voltage is provided to a positive voltage electrode of the plurality of capacitive coupling electrodes and the negative voltage is provided to a negative voltage electrode of the plurality of capacitive coupling electrodes.

26. The capacitively coupled plasma reactor according to claim 22, wherein the current balance circuit comprises a voltage level control circuit capable of varying a current balance control range.

27. The capacitively coupled plasma reactor according to claim 22, wherein the current balance circuit comprises a compensation circuit to compensate a leakage current.

28. The capacitively coupled plasma reactor according to claim 22, wherein the current balance circuit comprises a protection circuit to prevent any damage by an excessive voltage.

29. The capacitively coupled plasma reactor according to claim 20, wherein the plurality of capacitive coupling electrodes comprise a conductive region and an insulating region.

30. The capacitively coupled plasma reactor according to claim 20, wherein each of the first and second capacitive coupling electrode assembly comprises an insulating layer positioned between the capacitive coupling electrodes.

31. The capacitively coupled plasma reactor according to claim 20, wherein each of the first and second capacitive coupling electrode assemblies comprises an electrode mounting plate on which the plurality of capacitive coupling electrodes are mounted.

32. The capacitively coupled plasma reactor according to claim 31, wherein the electrode mounting plate of each of the first and second capacitive coupling electrode assemblies comprises a plurality of gas injection holes and a gas supply unit to supply a gas to the inside of each of the first and second plasma reactors through the gas injection holes.

33. The capacitively coupled plasma reactor according to claim 32, wherein the gas supply unit comprises a plurality of gas supply conduits.

34. The capacitively coupled plasma reactor according to claim 33, wherein each of the gas supply conduits comprises a control valve to independently control gas supply flux.

35. The capacitively coupled plasma reactor according to claim 20, wherein each of the first and second plasma reactors comprises a supporting bed inside, and the supporting bed on which a substrate to be processed is placed is biased or not biased.

36. The capacitively coupled plasma reactor according to claim 35, wherein the supporting bed is biased by a single frequency power or two or more different frequency power.

37. The capacitively coupled plasma reactor according to claim 36, wherein the supporting bed comprises a heater.

38. The capacitively coupled plasma reactor according to claim 35, wherein the supporting bed comprises an electrostatic chuck.

39. The capacitively coupled plasma reactor according to claim 20, wherein the plurality of capacitive coupling electrodes comprises a plurality of positive voltage electrodes and a plurality of negative voltage electrodes, and the positive voltage electrodes and the negative voltage electrodes have one or more array structures selected from a mutually alternating linear array structure, a matrix-type array structure, a mutually alternating spiral array structure and a mutually alternating concentric array structure.

40. The capacitively coupled plasma reactor according to claim 39, wherein the positive voltage electrodes, and the negative voltage electrodes have one or more structures selected form a barrier-type structure, a flat plate-type structure, a protrusion-type structure, a cylindrical post-type structure, a ring-shape structure, a spiral structure and a linear structure.

* * * * *